(12) United States Patent
Steiner et al.

(10) Patent No.: US 12,119,075 B2
(45) Date of Patent: Oct. 15, 2024

(54) EFFICIENT SOFT DECODING OF ERROR CORRECTION CODE VIA EXTRINSIC BIT INFORMATION

(71) Applicant: Kioxia Corporation, Tokyo (JP)

(72) Inventors: Avi Steiner, Kiriat Motzkin (IL); Ofir Kanter, Haifa (IL); Yasuhiko Kurosawa, Fujisawa Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 32 days.

(21) Appl. No.: 18/185,198

(22) Filed: Mar. 16, 2023

(65) Prior Publication Data

US 2024/0312552 A1  Sep. 19, 2024

(51) Int. Cl.
| | |
|---|---|
| G06F 11/10 | (2006.01) |
| G06F 11/07 | (2006.01) |
| G06F 11/30 | (2006.01) |
| G06F 13/16 | (2006.01) |
| G06F 13/28 | (2006.01) |
| G11C 29/02 | (2006.01) |
| G11C 29/52 | (2006.01) |
| H03M 13/11 | (2006.01) |
| H03M 13/15 | (2006.01) |

(52) U.S. Cl.
CPC ............ *G11C 29/52* (2013.01); *G11C 29/022* (2013.01); *G11C 29/024* (2013.01)

(58) Field of Classification Search
CPC ...... G11C 29/024; G11C 29/022; G11C 29/52
See application file for complete search history.

(56) References Cited

U.S. PATENT DOCUMENTS

| | | |
|---|---|---|
| 11,082,069 B1 | 8/2021 | Steiner et al. |
| 11,258,466 B1 | 2/2022 | Kanter et al. |
| 11,563,450 B1 | 1/2023 | Kanter et al. |
| 2017/0269992 A1 | 9/2017 | Bandic et al. |
| 2018/0159559 A1* | 6/2018 | Bazarsky ........... H03M 13/1102 |
| 2019/0295665 A1 | 9/2019 | Kojima |
| 2020/0104209 A1 | 4/2020 | El Gamal et al. |
| 2020/0218596 A1* | 7/2020 | Lu ........................... G06F 11/10 |
| 2020/0293398 A1* | 9/2020 | Symons .............. G06F 11/1068 |
| 2021/0397514 A1 | 12/2021 | Hwang et al. |
| 2022/0066670 A1 | 3/2022 | Naik et al. |

(Continued)

OTHER PUBLICATIONS

Non-Final Office Action in U.S. Appl. No. 18/184,862 dated Apr. 16, 2024.

(Continued)

*Primary Examiner* — Guy J Lamarre
(74) *Attorney, Agent, or Firm* — Foley & Lardner LLP

(57) ABSTRACT

Aspects of this technical solution can include selecting a plurality of memory locations at a memory device, the memory locations corresponding to a first page including a first plurality of bits and a second page including a second plurality of bits, modifying, based on the first plurality of bits and the second plurality of bits, a first voltage threshold corresponding to an estimated read voltage for the first plurality of bits, allocating, to a voltage range bounded by the first voltage threshold, a log-likelihood ratio (LLR), and decoding, based on the LLR corresponding to the voltage range, the first plurality of bits.

20 Claims, 16 Drawing Sheets

(56) References Cited

U.S. PATENT DOCUMENTS

2023/0251930 A1  8/2023  Nemati et al.

OTHER PUBLICATIONS

Co-Pending U.S. Appl. No. 17/406,929, "System and Method for Dynamic Inter-Cell Interference Compensation in Non-Volatile Memory Storage Devices", Avi Steiner, et al., filed Aug. 19, 2021.
Co-Pending U.S. Appl. No. 17/407,096, "System and Method for Dynamic Compensation for Multiple Interference Sources in Non-Volatile Memory Storage Devices", Avi Steiner, et al., filed Aug. 19, 2021.
Co-Pending U.S. Appl. No. 17/574,929, "System and Method for Pre-Soft-Decoding Tracking Form Nand Flash Memories", Hanan Weingarten, filed Jan. 13, 2022.
Co-Pending U.S. Appl. No. 17/702,359, "Dynamic Interference Compensation for Soft Decoding in Non-Volatile Memory Storage Devices", Avi Steiner, et al., filed Mar. 23, 2022.

\* cited by examiner

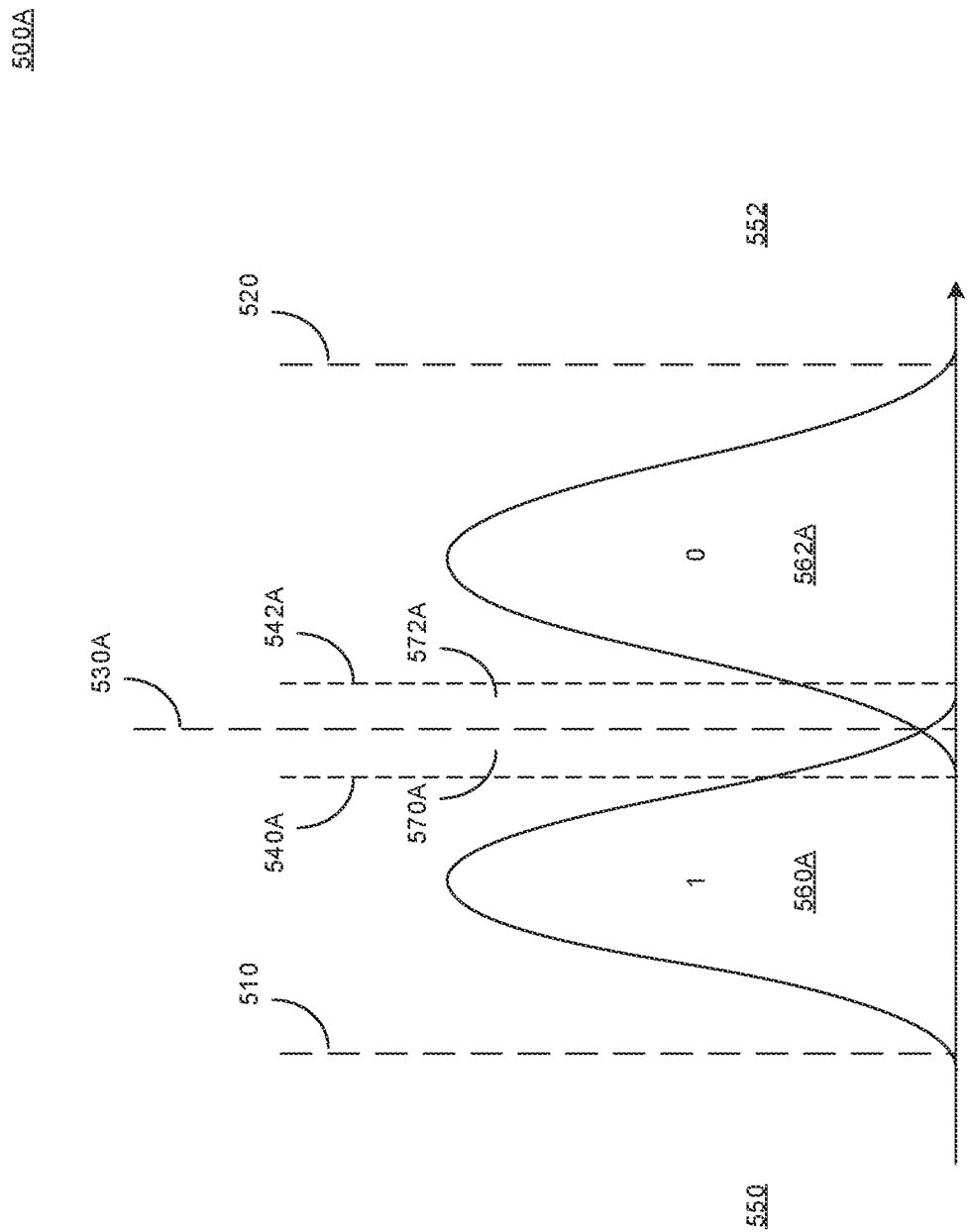

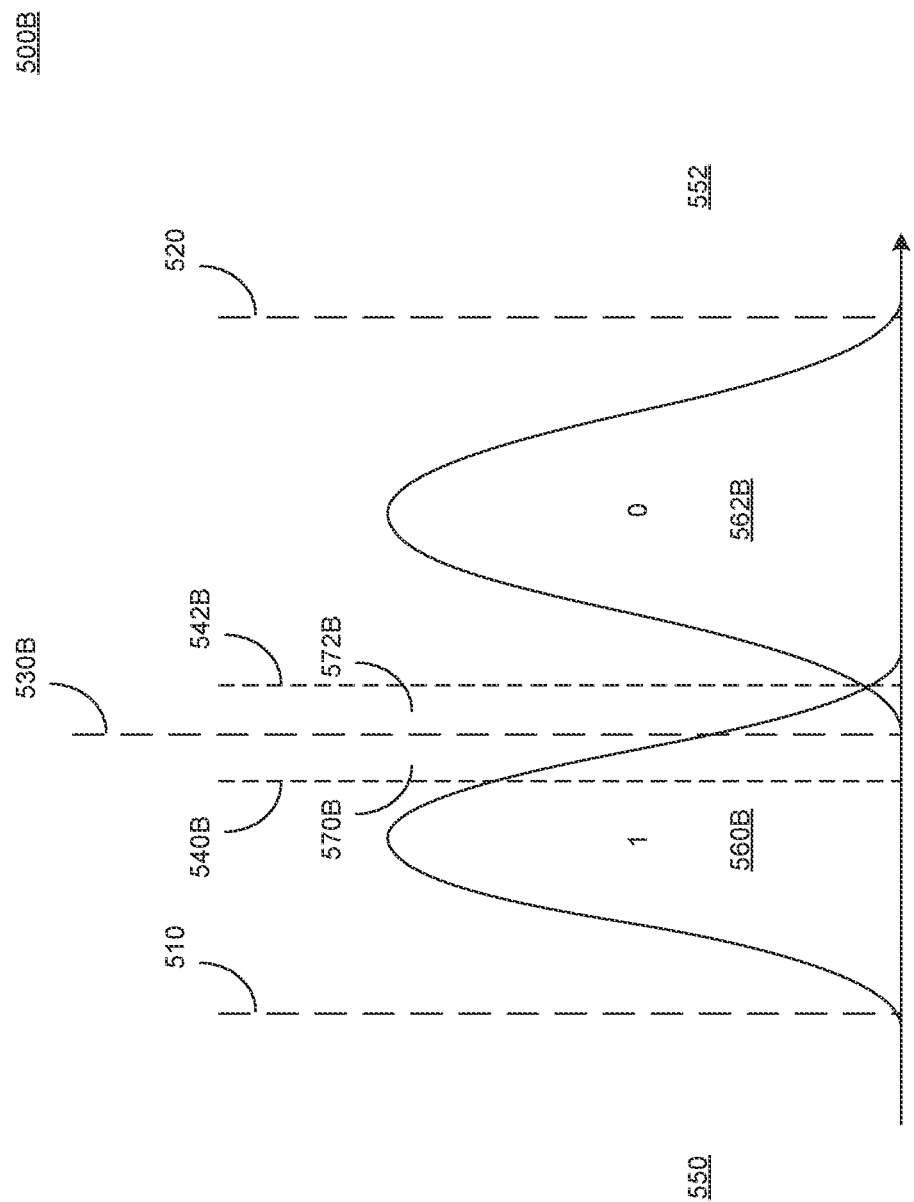

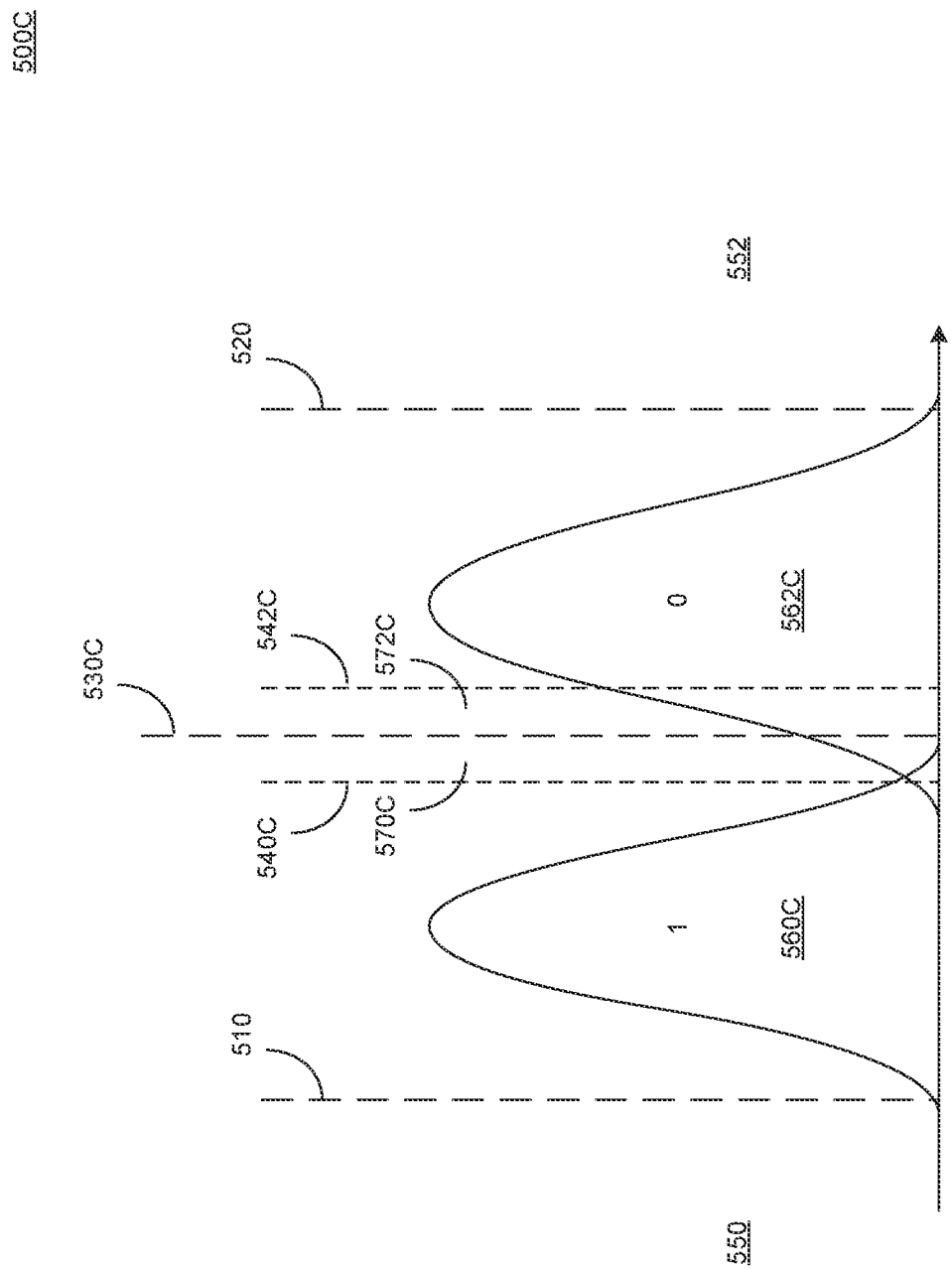

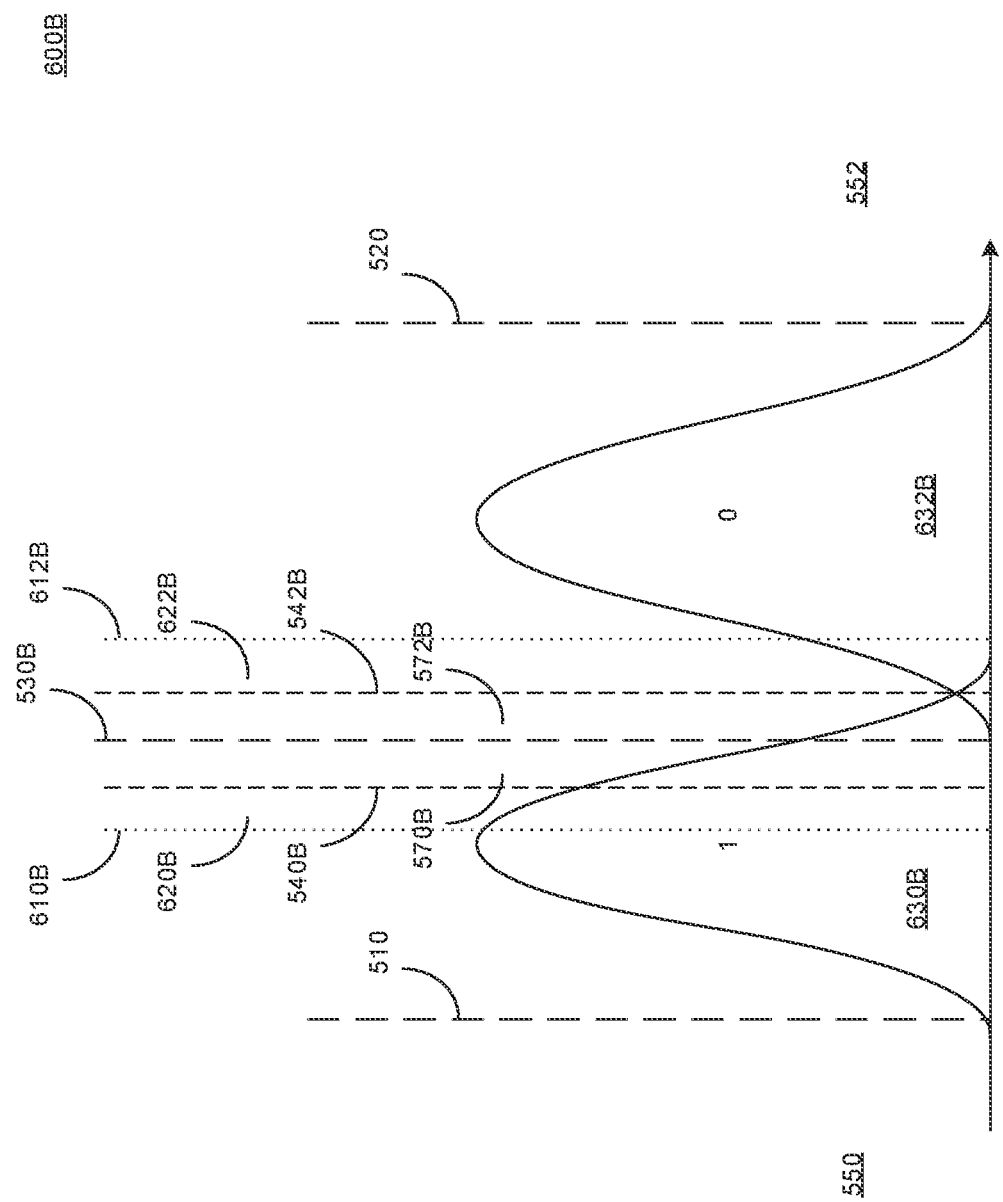

EFFICIENT SOFT DECODING OF ERROR CORRECTION CODE VIA EXTRINSIC BIT INFORMATION

TECHNICAL FIELD

The present disclosure relates generally to systems and methods for soft decoding for correcting errors in data storage devices.

BACKGROUND

Flash memory devices (e.g., NAND flash memory devices) enable page reads based on voltage thresholds of the flash memory devices. Due to different noise (e.g., NAND noise) and interference sources during programming and read, errors on information bits stored in flash memory devices can occur. Such errors may be due to one or more of programming errors, reads with non-optimal thresholds, retention/read-disturb stresses, and so on. A strong error correction code (ECC) can allow fast programming (with possibly high programming errors) and reads under high stress conditions and/or with low-complexity digital signal processing (DSP).

SUMMARY

This technical solution is directed at least to a soft decoder device integrable with a memory device. The soft decoder perform error correction based on read operations performed at the memory device, based on extrinsic page information that includes bits of one or more pages in addition to a page being addressed. The soft decoder can determine whether to perform a secondary decoding or error correction process with respect to a particular page of bits in a memory block, by performing an additional read operation with read thresholds at one or more particular offsets from a predetermined read threshold for a particular page. Performing fast soft sampling using extrinsic page information thus provides at least the technical improvement of improved decoding capability. For example, page information can be available without additional NAND reads, and therefore can be used to achieve a technical improvement of higher decoding capability with no additional latency. Thus, a technical solution for soft decoding for correcting errors in data storage devices is provided.

At least one aspect is directed to a computer-implemented method of soft correction in a memory device. The method can include selecting a plurality of memory locations at a memory device, the memory locations corresponding to a first page can include a first plurality of bits and a second page can include a second plurality of bits. The method can include modifying, based on the first plurality of bits and the second plurality of bits, a first voltage threshold corresponding to an estimated read voltage for the first plurality of bits. The method can include allocating, to a voltage range bounded by the first voltage threshold, a log-likelihood ratio (LLR). The method can include decoding, based on the LLR corresponding to the voltage range, the first plurality of bits.

At least one aspect is directed to a memory system can include a non-volatile memory. The system can include a controller for performing operations on the non-volatile memory. The system can select a plurality of memory locations at a memory device, the memory locations corresponding to a first page can include a first plurality of bits and a second page can include a second plurality of bits. The system can modify, based on the first plurality of bits and the second plurality of bits, a first voltage threshold corresponding to a read voltage for the first plurality of bits. The system can allocate, to a voltage range bounded by the first voltage threshold, a log-likelihood ratio (LLR). The system can decode, based on the LLR corresponding to the voltage range, the first plurality of bits.

At least one aspect is directed to a non-transitory computer readable medium can include one or more instructions stored thereon and executable by a processor. The processor can select, by a processor, a plurality of memory locations at a memory device, the memory locations corresponding to a first page can include a first plurality of bits and a second page can include a second plurality of bits. The processor can modify, based on the first plurality of bits and the second plurality of bits, a first voltage threshold corresponding to a read voltage for the first plurality of bits. The processor can allocate, to a voltage range bounded by the first voltage threshold, a log-likelihood ratio (LLR). The processor can decode, based on the LLR corresponding to the voltage range, the first plurality of bits.

BRIEF DESCRIPTION OF THE DRAWINGS

FIG. 5A depicts an example read state for a soft decode operation, according to some arrangements;

FIG. 5B depicts an example down-shifted read state for a soft decode operation, according to some arrangements;

FIG. 5C depicts an example up-shifted read state for a soft decode operation, according to some arrangements;

FIG. 6B depicts an example down-shifted read state for an extended soft decode operation, according to some arrangements;

Figure 1:
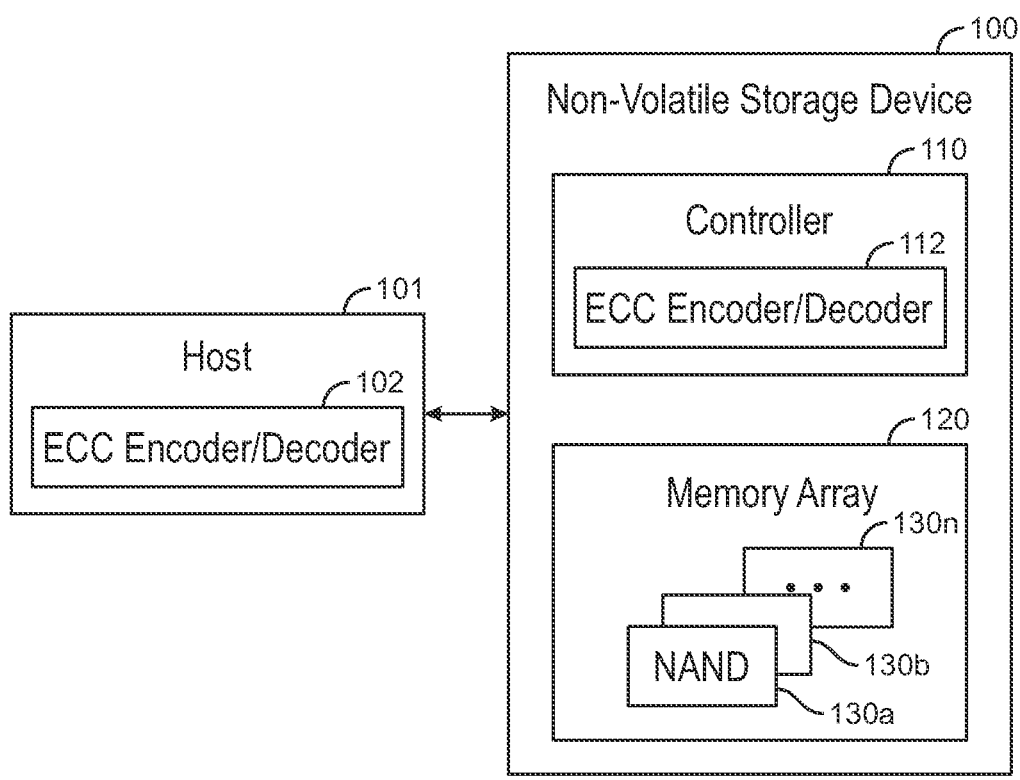
FIG. 1 shows a block diagram of examples of a system including a non-volatile storage device and a host, according to some arrangements.

It will be recognized that some or all of the figures are schematic representations for purposes of illustration. The figures are provided for the purpose of illustrating one or more embodiments with the explicit understanding that they will not be used to limit the scope or the meaning of the claims.

DETAILED DESCRIPTION

Referring generally to the figures, systems and methods for soft decoding to correct errors in data storage devices are discussed. In various NAND devices, multiple bits are stored in a same cell. Groups of multiple bits can correspond to pages, and bits stored in a same cell can correspond to rows. When a memory device reads and decodes data stored on one page, the device can use the data from other pages on same row and read thresholds corresponding to the read operation for bits of the page, in order to increase err correction capability at the memory device. Thus, the memory device can have improved error correction capability and concurrently reduce the latency of the soft decoding process. In some system flows, this extrinsic page information is available without additional NAND reads, and therefore can be used to achieve higher hard-decoder capability with no additional latency.

For example, extrinsic page information for each bit can indicate reliability of that bit. The extrinsic page information can be used in the decoding process and can be used for soft decoding for assigning high-reliability LLRs for bits distanced from a decision threshold. For example, distance can be based on extrinsic page information. The modulation of data programmed to NAND can correspond to amplitude shift keying (ASK), with N programmable states. The corresponding number of pages can correspond, for example, to log 2(N). This example logical separation of pages can provide a technical improvement of a read operation from a memory device having low latency, using approximately log 2(N) thresholds. The log 2(N) thresholds can correspond to log 2(N) internal read operations per page read. Most errors can be isolated between two neighboring lobes of a memory row around the read thresholds. Therefore, information of extrinsic pages can indicate codeword bits which are located at distance from the hard decision thresholds sufficient to be considered reliable. Extrinsic page information can be available during sequential read operations. For example, sequential reads can be used during operations to read large data files read from a host, during refresh operations for memory blocks, or garbage collection of memory blocks. For example, one or more of extrinsic page information, LLRs and ICI information can be obtained during sequential read without any additional reads, to provide at least a advantages in both performance and reliability. For example, additional read can correspond to read operations unrelated to reading data from a memory device for transmission to a host.

Using page information during hard and soft decoding can provide at least the technical improvement of enables higher endurance of bits and higher retention of bit information in memory devices, and high performance, due to the technical solution of using extrinsic page information with read thresholds for obtaining all page information.

Thus, this technical solution can include a decoder with higher error correction capability and reduced latency, to provide at least a technical improvement of increased quality of service (QoS) of a system. For example, extrinsic-page information can be obtained by read operations using read thresholds corresponding to extrinsic pages in the same rows. For example, extrinsic page information is available without additional NAND reads, achieve a gain in error correction reliability with no additional latency. Other read pages need not be decoded, since the values on the bits associated with target codeword are highly reliable.

Threshold tracking during sequential read flows in case of hard decoding failure can be performed, with quick training (QT) from all page information. This technical solution can provide QT with the technical improvement of zero overhead during read operation of a memory device. For example, this technical solution can include at least a technical improvement of bit error rate (BER) estimation with zero-overhead QT during sequential read. This BER estimation can determine the next stage of decoding. For example, the BER estimation classification of low/high BER to decide whether to perform Hard Bit (HB) or Soft Bit (SB) decoding after threshold estimation. For example, HB decoding can correspond at least to hard decoding as discussed herein, and SB decoding can corresponding at least to soft decoding, soft sample, ICI compensation, or any combination thereof, as discussed herein.

For example, this technical solution can include at least a technical improvement of a sequential read operation using all page information, to perform extended hard decoding and extended soft decoding with inter-cell interference (ICI) compensation and BER estimation. The sequential read operation can achieve lower latency and higher capability. For example, this technical solution can include at least a technical improvement of dynamic ICI compensation with zero-overhead QT, by using all page read, current thresholds, and ICI read, a linear estimator, or a DNN are suggested for estimation of ICI compensation thresholds. During a sequential read operation. buffering of codewords from same physical row can be performed. The buffering of codewords can include a low-overheard labelling operation to generate LLRs corresponding to a particular read operation. Buffering of all-page information as well as ICI information can thus provide a technical improvement to reduce the number of reads required for ICI compensation during a sequential read operation.

To assist in illustrating the present implementations, FIG. 1 shows a block diagram of a system including a non-volatile storage device 100 coupled to a host 101 according to some implementations. In some examples, the host 101 can be a user device operated by a user. The host 101 may include an operating system (OS), which is configured to provision a filesystem and applications which use the filesystem. The filesystem communicates with the non-volatile storage device 100 (e.g., a controller 110 of the non-volatile storage device 100) over a suitable wired or wireless communication link or network to manage storage of data in the non-volatile storage device 100. In that regard, the filesystem of the host 101 sends data to and receives data from the non-volatile storage device 100 using a suitable interface to the communication link or network.

In some examples, the non-volatile storage device 100 is located in a datacenter (not shown for brevity). The datacenter may include one or more platforms, each of which supports one or more storage devices (such as but not limited to, the non-volatile storage device 100). In some implementations, the storage devices within a platform are connected to a Top of Rack (TOR) switch and can communicate with each other via the TOR switch or another suitable intra-platform communication mechanism. In some implementations, at least one router may facilitate communications among the non-volatile storage devices in different platforms, racks, or cabinets via a suitable networking fabric. Examples of the non-volatile storage device 100 include but are not limited to, a solid state drive (SSD), a non-volatile dual in-line memory module (NVDIMM), a Universal Flash Storage (UFS), a Secure Digital (SD) device, and so on.

The non-volatile storage device 100 includes at least a controller 110 and a memory array 120. Other components of the non-volatile storage device 100 are not shown for brevity. The memory array 120 includes NAND flash memory devices 130a-130n. Each of the NAND flash memory devices 130a-130n includes one or more individual NAND flash dies, which are non-volatile memory (NVM) capable of retaining data without power. Thus, the NAND flash memory devices 130a-130n refer to multiple NAND flash memory devices or dies within the flash memory device 100. Each of the NAND flash memory devices 130a-130n includes one or more dies, each of which has one or more planes. Each plane has multiple blocks, and each block has multiple pages.

While the NAND flash memory devices 130a-130n are shown to be examples of the memory array 120, other examples of non-volatile memory technologies for implementing the memory array 120 include but are not limited to, dynamic random access memory (DRAM), magnetic random access memory (MRAM), phase change memory (PCM), ferro-electric RAM (FeRAM), and so on. The ECC structure described herein can be likewise implemented on memory systems using such memory technologies and other suitable memory technologies.

Examples of the controller 110 include but are not limited to, an SSD controller (e.g., a client SSD controller, a datacenter SSD controller, an enterprise SSD controller, and so on), a UFS controller, or an SD controller, and so on.

The controller 110 can combine raw data storage in the plurality of NAND flash memory devices 130a-130n such that those NAND flash memory devices 130a-130n function as a single storage. The controller 110 can include microcontrollers, buffers, error correction systems, flash translation layer (FTL) and flash interface modules. Such functions can be implemented in hardware, software, and firmware or any combination thereof. In some arrangements, the software/firmware of the controller 110 can be stored in the non-volatile storage 120 or in any other suitable computer readable storage medium.

The controller 110 includes suitable processing and memory capabilities for executing functions described herein, among other functions. As described, the controller 110 manages various features for the NAND flash memory devices 130a-130n including, but not limited to, I/O handling, reading, writing/programming, erasing, monitoring, logging, error handling, garbage collection, wear leveling, logical to physical address mapping, data protection (encryption/decryption), and the like. Thus, the controller 110 provides visibility to the NAND flash memory devices 130a-130n.

The error correction systems of the controller 110 can include or otherwise implement one or more ECC encoders and one or more ECC decoders, collectively referred to as an ECC encoder/decoder 112. The ECC encoders of the ECC encoder/decoder 112 are configured to encode data (e.g., input payload) to be programmed to the non-volatile storage 120 (e.g., to the NAND flash memory devices 130a-130n) using the ECC structures described herein. The ECC decoders of the ECC encoder/decoder 112 are configured to decode the encoded data to correct programming errors, errors caused by reading with non-optimal thresholds, errors caused by retention/read-disturb stresses, and so on, in connection with a read operation. To enable low-complexity processing, the ECC encoder/decoder 112 is implemented on hardware and/or firmware of the controller 110.

In some implementations, the host 101 includes an ECC encoder/decoder 102 that can use the ECC structures described herein. The ECC encoder/decoder 102 is software running on the host 101 and includes one or more ECC encoders and one or more ECC decoders. The ECC encoders of the ECC encoder/decoder 102 are configured to encode data (e.g., input payload) to be programmed to the non-volatile storage 120 (e.g., to the NAND flash memory devices 130a-130n) using the ECC structures described herein. The ECC decoders of the ECC encoder/decoder 102 are configured to decode the encoded data to correct errors, in connection with a read operation. In some arrangements, one of the ECC encoder/decoder 102 or the ECC encoder/decoder 112 employs the ECC structures described herein. In some implementations, the ECC encoders of the ECC encoder/decoder 102 are configured to encode data (e.g., input payload) to be written to multiple instances of the non-volatile storage device 100 using a redundancy code, examples including, but not limited to, erasure codes and RAID levels 0-6.

An encoding scheme such as the HFPC encoding scheme can be used to encode each of the plurality of short codewords. In some arrangements, the HFPC code structure is composed of multiple component codes. Each component code can be, for example, a BCH code. A number of components code n can be determined by the correction capability of each component code and code rate. For example, given a minimum distance $D_{min}$ per component code, the correction capability t of each component code can be represented by (Equation 1):

$$t=(D_{min}-1)/2 \qquad (1),$$

where the $D_{min}$, of a linear block code is defined as the smallest Hamming distance between any pair of code vectors in the code. The number of redundancy bits r can be represented by (Equation 2):

$$r=Q \cdot (D_{min}-1)/2 \qquad (2),$$

where Q is a Galois field parameter for the BCH component code defined over GF ($2^Q$). Given a code rate R and payload length K bits, a number of component codes needed can be determined by (Equation 3 or Equation 4 respectively):

$$n = \left\lfloor K \cdot \frac{1-R}{r \cdot R} \right\rfloor, \text{ and} \qquad (3)$$

$$n = \left\lfloor 2K \cdot \frac{1-R}{Q \cdot (D_{min}^{-1}) \cdot R} \right\rfloor. \qquad (4)$$

In some examples, input payload bits (e.g., including the information bits and the signature bits) are arranged in a pseudo triangular matrix form and to perform folded encoding (e.g., folded BCH encoding) for every component code. In some examples, every bit in a payload (e.g., every information bit) can be encoded by (at least) two component codes (also referred to as "code components"), and each component code intersects with all other component codes. That is, for component codes that encode the information bits, the encoding process is performed such that systematic bits of every component code is also encoded by all other component codes. The component codes together provide encoding for every information bit using the component codes.

Figure 2:
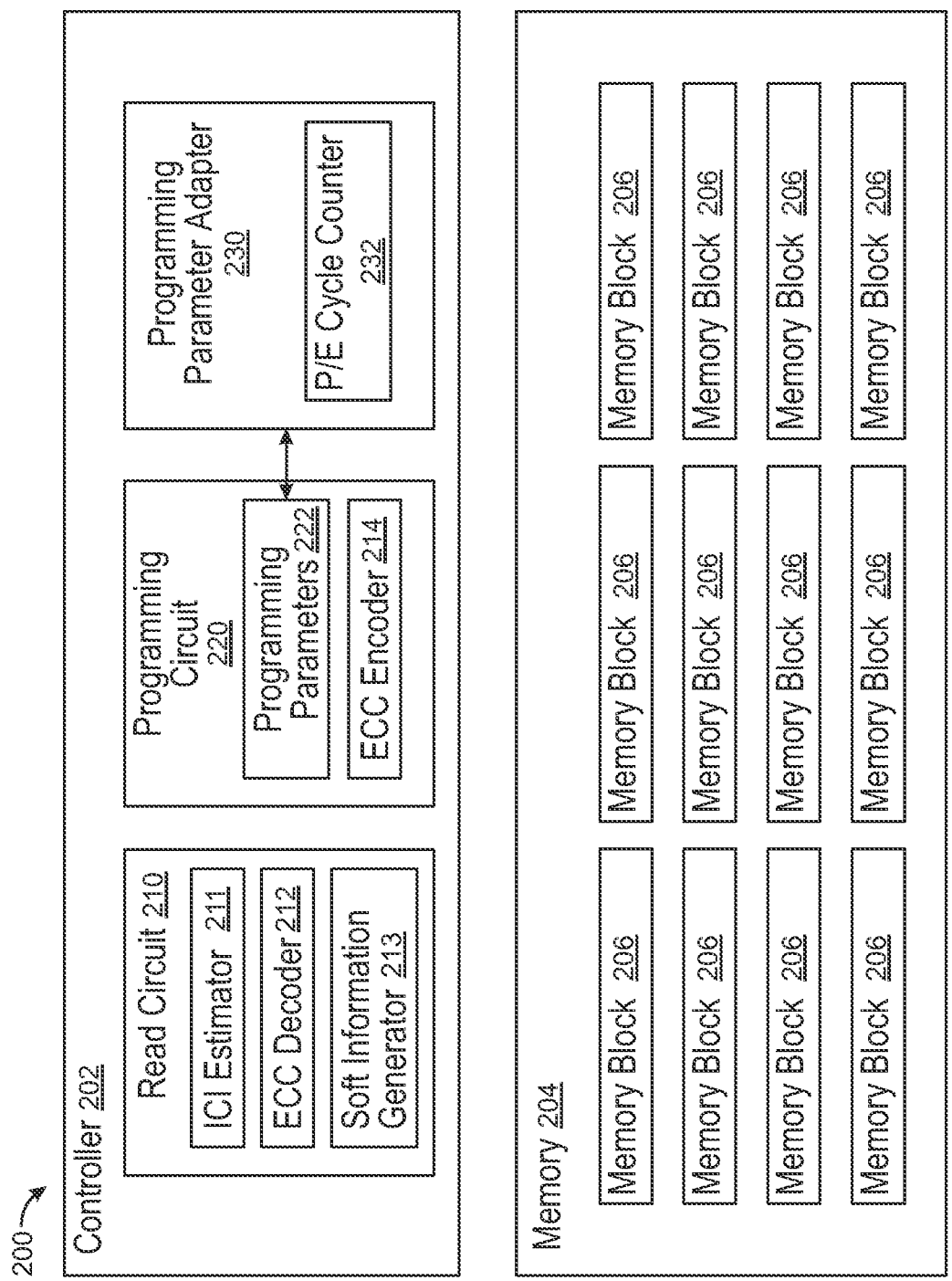
FIG. 2 is a block diagram illustrating a non-volatile storage device, according to some arrangements.

FIG. 2 is a block diagram illustrating a non-volatile storage device 200 according to some arrangements. In some arrangements, the non-volatile storage device may be a flash memory system which can perform any of the methods described in the present disclosure. Examples of the device 200 include but are not limited to, a SSD, a Non-Volatile Dual In-Line Memory Module (NVDIMM), UFS, a SD device, and so on.

In some arrangements, a different device (not shown) may communicate with the device 200 over a suitable wired or wireless communication link to execute some or all of the methods described herein. The device 200 may include a memory module or memory device 204 and a controller 202 for performing operations of the plurality of cells.

The controller 202 may include a read circuit 210, a programming circuit (e.g., a program DSP) 220 and a programming parameter adapter 230. In some arrangements, the read circuit 210 may include an ICI estimator 211, an ECC decoder 212 and/or a soft information generator 213. In some arrangements, the programming circuit 220 may include an ECC encoder 214 and programming parameters 222. In some arrangements, the programming parameter adapter 230 may include a program/erase cycle counter 232. Examples of the controller 202 include but are not limited to, an SSD controller (e.g., a client SSD controller, a datacenter SSD controller, an enterprise SSD controller, and so on), a UFS controller, or an SD controller, and the like. Arrangements of controller 202 can include additional or fewer components such as those shown in FIG. 2.

The controller 202 can combine raw data storage in the plurality of memory blocks 206 such that the memory blocks 206 function as a single storage. The controller 202 can include microcontrollers, buffers, error correction systems, flash translation layer (FTL) and flash interface modules. Such functions can be implemented in hardware, software, and firmware or any combination thereof. In some arrangements, the software/firmware of the controller 210 can be stored in the memory 204 or in any other suitable computer readable storage medium.

The controller 202 includes suitable processing and memory capabilities for executing functions described herein, among other functions. As described, the controller 202 manages various features for the memory block 206 in the memory 204 including, but not limited to, I/O handling, reading, writing/programming, erasing, monitoring, logging, error handling, garbage collection, wear leveling, logical to physical address mapping, data protection (encryption/decryption), and the like.

In some arrangements, the ICI estimator 211 of the read circuit 210 may be configured to estimate an interference state based on a result of a read operation on a first neighboring cell of a first cell (e.g., a target cell) among the plurality of cells. In some arrangements, a statistical dependency modeling of main interference sources and their impact can be characterized. For example, the ICI estimator 211 may be configured to perform a statistical dependency modeling of interference sources and their impact.

In some arrangements, the statistical dependency modeling of main interference sources and their impact can be characterized offline. For example, statistical dependency modeling may be performed offline when different programming schemes of different non-volatile memory storage devices increases the difficulty of performing statistical dependency modeling online. For example, the programming scheme of one generation of non-volatile memory storage devices may be different from that of another generation of non-volatile memory storage devices.

In some arrangements, the ICI estimator 211 may perform a statistical dependency modeling of interference sources and their impact offline. In some arrangements, to perform such statistical dependency modeling offline for a target non-volatile memory storage device (e.g., the memory 204), the ICI estimator 211 or the computing system may store, in memory (e.g., in a mass storage device connected to an I/O (USB, IEEE1394, Small Computer System Interface (SCSI), Serial Advanced Technology Attachment (SATA), Serial Attached SCSI (SAS), PCI Express (PCIe) etc.), at least information on the programming scheme of the target non-volatile memory storage device so that it can accurately model the interference sources and their impact in the target non-volatile memory storage device.

In estimating the interference state, the ICI estimator 211 may be further configured to estimate a level at which the first neighboring cell is programmed. For example, the ICI estimator 211 may estimate, based on a result of a read operation on the first neighboring cell, a level at which the first neighboring cell is programmed. The ICI estimator 211 may then estimate an interference state of the first neighboring cell based on the estimated programmed level of the first neighboring cell. In some arrangements, the interference state of a neighboring cell is an estimated programmed level of the neighboring cell.

In estimating the interference state, the ICI estimator 211 may be further configured to obtain the result of the read operation on the first neighboring cell from pre-fetch of a next page read or by saving a previous read result. For example, in estimating the interference state for a target cell in a target page, the ICI estimator 211 may obtain a read result of a neighboring cell (of the target cell) in a next page that is to be read next to the target page, by pre-fetching the read result of the next page. In some arrangements, the ICI estimator 211 may obtain a read result of a neighboring cell (of the target cell) in a previous page that has been read prior to the target page, by saving and reusing the read result of the previous page. In this manner, in some arrangements, the ICI estimator 211 may be configured to estimate interference states for decoding results of read operations on the plurality of cells by reading the rows of the plurality of cells sequentially and only once. In some arrangements, the ICI estimator 211 may estimate the inference state of a neighboring cell from a distribution of state (or level) programmed in the neighboring cell.

In some arrangements, the ICI estimator 211 may analyze and model the interference state for a target cell as a function of one or more cells adjacent to the target cell. In some arrangements, to analyze the contribution of interference of each neighboring cell, a single neighboring row state estimation may be performed. For example, the ICI estimator 211 can estimate the interference state of a neighboring row from a hard read before decoding. In some arrangements, the ICI estimator 211 can estimate the interference state of a neighboring row post decoding as true data.

In some arrangements, once interference sources and their impact are modeled or identified, simple signal processing operations can be performed to compensate for or decouple the interference. For example, sampling results of a target page can be post-processed to compensate for or decouple the interference. In some arrangements, reliability information for reading or decoding of a target page can be provided. For example, the soft information generator 213 of the read circuit 210 may be configured to generate reliability information (e.g., calculating a probability of error) and provide soft information based on the reliability information. In some arrangements, the soft information generator 213 of the read circuit 210 may be configured to generate soft information based on the estimated interference state and a read value from the first cell.

The ECC decoder 212 may be configured to decode soft information as a result of read operations on cells. Additionally, or alternatively, the ECC decoder 212 may correct errors, improving accuracy and stress relief of a non-volatile memory storage controller. The controller 202 may also include a programming circuit 220. The programming circuit may include an ECC encoder 214 and programming parameters 222. For example, the ECC encoder 214 may determine the soft labels from the soft samples. The controller 202 may also include programming parameter adapter 230. The adapter 230 may adapt the programming parameters 222 in the programming circuit 220. The adapter 230 in this example may include a Program/Erase (P/E) cycle counter 232. Although shown separately for ease of illustration, some or all of the adapter 230 may be incorporated in the programming circuit 220.

The memory 204 may be an array of memory blocks 206. The memory blocks may include non-volatile memory such as NAND flash memory, dynamic random access memory (DRAM), magnetic random access memory (MRAM), phase change memory (PCM), ferro-electric RAM (Fe-RAM), and so on. In some arrangements, the memory 204 may have a plurality of cells. In some arrangements, each of the memory blocks 206 may have a plurality of cells. In some arrangements, the cell memory (e.g., the memory 204 or a memory block 206) may include rows and columns of the plurality of cells. In some arrangements, a memory block 206 may include a plurality of pages (not shown) and a page may be defined as cells linked with the same wordline, which correspond to a row of cells. In some arrangements, neighboring cells of a target cell are cells adjacent to the target cell. For example, each of a first neighboring cell and a second neighboring cell (of a first cell) may be positioned at the same column as a column of the first cell and at a row adjacent to a row of the first cell. Additionally, or alternatively, the memory 204 can comprise or be implemented using a plurality of dies, each of the dies containing a plurality of the blocks 206.

Figure 3:
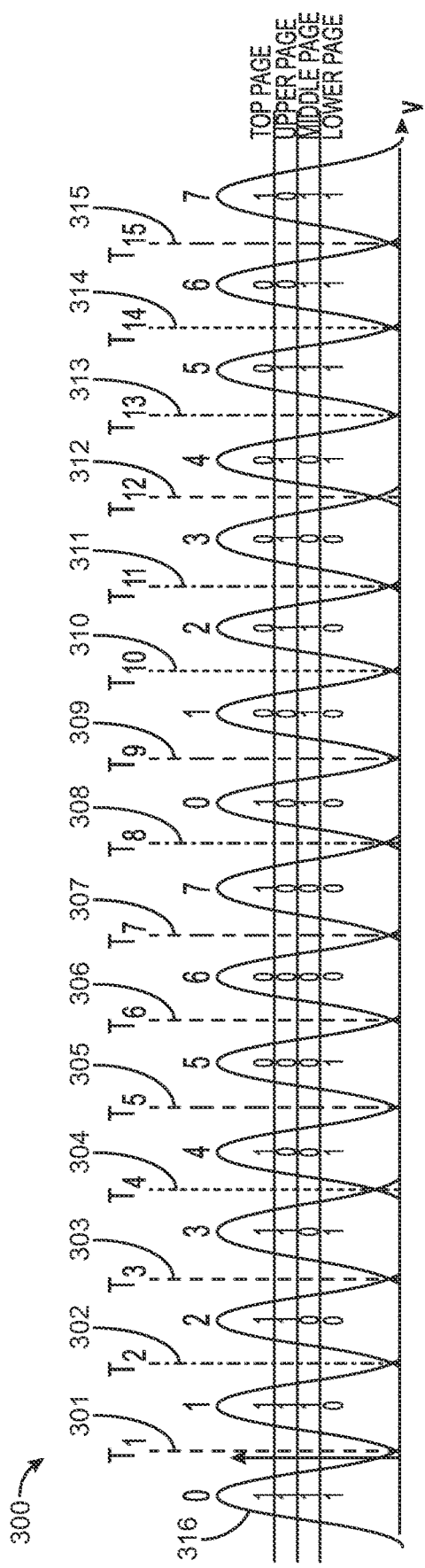
FIG. 3 is a diagram of histograms with VT distributions of a four bits per cell (bpc) non-volatile memory storage device, according to some arrangements.

FIG. 3 is a diagram of histograms 300 with VT distributions of a four bits per cell (bpc) non-volatile memory storage device (e.g., a flash memory device such as a QLC with 16 programmable states), according to some arrangements. Depicted are 16 lobes (distributions, or histograms) corresponding to the 16 different bit combinations of four bits represented by the charge state of the cell. A lower page read requires using thresholds T1 301, T3 303, T6 306 and T12 312 to separate the histograms into those with LSBs of 0 into those of LSBs of 1. Read thresholds T2 302, T8 308, T11 311, and T13 313 are used to separate the histograms into those with LSBs of 0 and those with LSBs of 1 for reading middle pages, read thresholds T4 304, T10 310, and T14 314 are used to separate the histograms into those with LSBs of 0 and those with LSBs of 1 for reading upper pages, and read thresholds T5 305, T7 307, T9 309 and T15 315 are used to separate the histograms into those with LSBs of 0 and those with LSBs of 1 for reading top pages. The lower histogram 300 may be considered the erase level.

As described herein, when read operations are performed on a target row, interference may be induced. In some implementations, a fixed ICI compensation may be added to read thresholds. However, the fixed compensation may not be effective in improving BER because depending on the ICI state, stress condition of the device, and the read threshold, the degree of the added ICI compensation varies. For example, while the effect of an induced ICI state may be known (e.g., shifting the threshold higher or lower than the ideal/optimum ICI compensation threshold associated with no ICI state threshold), the degree of the shift in the direction may be unknown.

Figure 4:
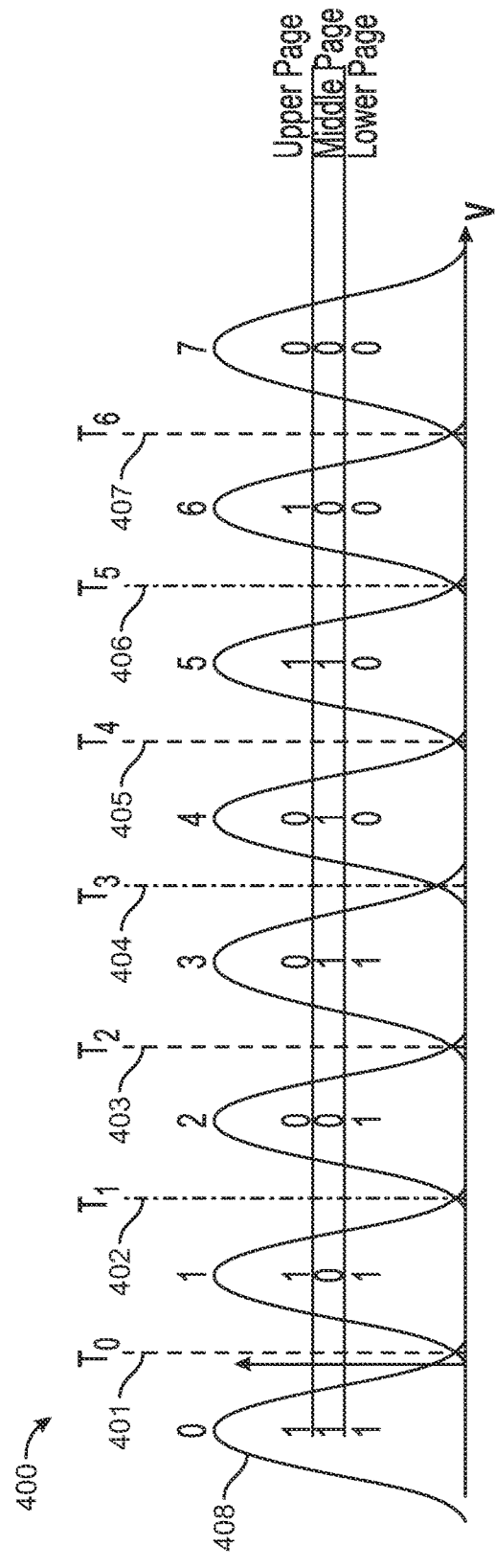
FIG. 4 is a diagram of a superposition of eight possible VT distributions of a three bits per cell flash memory device without any ICI information, according to some arrangements.

Now, arrangements of estimating an interference state will be described with reference to FIG. 4. FIG. 4 is a diagram of a superposition of the eight possible VT distributions 400 of a three bits per cell (bpc) memory device without any ICI information, according to some arrangements. Depicted are eight lobes (distributions, or histograms) corresponding to the eight different bit combinations of three bits represented by the charge state of the cell. A lower page read requires using thresholds $T_3$ 403 to separate the histograms into those with LSBs of 0 and those with LSBs of 1. Read thresholds $T_0$ 400, $T_2$ 402 and $T_5$ 405 are used to separate the histograms into those with LSBs of 0 and those with LSBs of 1 for reading middle pages, and read thresholds $T_1$ 401 $T_4$ 404 and $T_6$ 406 are used to separate the histograms into those with LSBs of 0 and those with LSBs of 1 for reading upper pages. The lower histogram 407 may be considered the erase level.

FIG. 4 shows a voltage threshold distribution of a 3 bits per cell (bpc) flash memory device. The voltage threshold (VT) distribution includes eight lobes. An MSB (most significant bit) page read requires using thresholds T0, T4. For reading CSB (center significant bit) pages the read thresholds T1, T3 and T5 are used. For reading LSB (least significant bit) pages the read thresholds T2 and T6 have to be used. The lower most distribution is known as the erase level.

Due to different NAND noise and interference sources during programming and during read, there may be errors in the programmed and read output. This can be due to programming errors, or during read with non-optimal thresholds or following retention/read-disturb stresses, etc. The result of all these noise sources is errors on the information bits that are originally saved to NAND. A strong error correction code (ECC) can allow faster programming, with possibly higher programming errors, and read under high stress conditions, and/or with lower complexity digital signal processing (DSP).

A code rate is defined by the ratio of its information content, called payload, to the overall size of a codeword. For example, for a code that contains k bits and r redundancy bits that rate is defined by $R_c=k/(k+r)$. The common encoding methods are not very well suited to support high rate codes when both hard and soft decoding are considered. For example, for conventional low-density parity-check codes (LDPC) for very high rates (say 0.9), the code length tends to be considerable resulting in a very complex and costly implementation.

In some implementations, a special structure of multi-dimensional encoding with simple code components can obtain high decoding efficiency with a reasonable complexity for both hard input or soft input to the decoder. These properties make a code especially suitable for storage applications such as NAND Flash devices or controllers for NAND flash. Some key features of this coding scheme are instrumental in designing a coding system for storage. One of the features is high raw bit error rate (RBER) error correction capability with hard input to the decoder, which is important in a storage system since it requires a single read operation. This means that high performance on read from the storage device may be achieved throughout the device lifespan. Another key feature is configurability. For example, the code rate may be configured per application, and with a single engine it is possible to configure with firmware the code parameters which determine the payload size and redundancy size. This feature allows using different codes for different type of pages, according to their RBER characteristics. Alternatively, payload size can be determined such that the tradeoff of performance vs reliability is optimized. Another key feature is RBER error correction capability with soft input to the decoder. This feature is important in storage systems since it can provide high reliability at high Program/Erase (P/E) cycle counts and difficult retention conditions. This feature is crucial for storage systems which typically require a very small undecodable bit error rate (UBER) of 1E-15.

In multi-dimensional encoding, a stream of data is passed through a set of multiple component encoders, which together encode the full payload into a single codeword. For example, Bose-Chaudhuri-Hocquenghem (BCH) encoding may be done by using a shift register through which the systematic data is passed. Therefore, that data simply passes through the component encoders without being modified while the shift-register advances. When the systematic data of the code completely passed through the shift-register, the content of the shift register is the redundancy of the code and is appended to the data stream. This principle works for all component encoders in all dimensions.

Multi-dimensional encoding also can be obtained with product codes or symmetric product codes, which is a special case of product codes, and may provide improved capabilities. These structures create a product of code components to obtain a full codeword, and the decoding process typically involves iterative decoding of the component codes. In some arrangements, the ECC structure includes a modified half product code, referred to as a half folded-product code (HFPC). A HFPC structure is composed of multiple small code components, where each code component can be for example a BCH code. The number of code components n is determined by the correction capability of each component and the required code rate.

FIGS. 5A-C are directed to soft sampling of voltage thresholds for error correction by soft decoding. For example, a memory device can perform read operation at one or more soft decoding voltage thresholds based on a hard decoding voltage threshold. The hard decoding voltage threshold can correspond to a voltage threshold corresponding to a read operation of a particular page of a row of a memory block. The voltage thresholds can be performed as reads at various offsets from a hard decoding voltage threshold, and various soft decoding voltage thresholds can be modified to create a soft voltage read threshold corresponding to a particular boundary thresholds between various lobes of a various bit positions in a page or row. Thus, this technical solution, including at least the read states of FIGS. 5A-C provide the technical improvement of capability of soft 2-bit (SB2) decoding when using sequential soft decoding (called also fast-soft) as compared to joint components soft decoding (called also safe decoding). For example, a 4 KB code rate of 0.9 can be simulated without using all page information. A memory device can perform soft decoding sampling, for example, with as few as three read operations in total, that can be efficiently obtained by adding two read operations performed during a hard decoding operation.

According to embodiments of this invention, all-page information is obtained with zero overhead and can be used to assign high LLRs for bits which are marked as far from HB thresholds. For example, a standard SB2 sampling can assign typically two LLR values around a hard decision threshold such as +/−5, +/−12, and these values will be used across all codeword bits. When other page information is available, the highly reliable bits far from the hard-decision threshold can receive a high LLR e.g. +/−30. Then, the LLR values of the codeword will be +/−5, +/−12, +/−30, where in QLC it means that at least 50% of the codeword bits received |LLR|=30, and in TLC for example that will be 25% or 50% depending on page type.

In some cases a read-flow may include several stages of read-thresholds adaptations and further decoding attempts. This may also include interference compensation, by reading a neighboring row that induces interference, and applying a corresponding compensation, in order to reduce BER of target row. According to embodiments of this invention, using all page information after ICI compensation can be applied for hard-decoding, or soft decoding right after ICI cancellation with multiple reads has been performed. The result of ICI compensation with reduced BER can be decoded with hard-only decoding if BER is sufficiently low, or otherwise a soft decoding using all available LLR information can be decoded. In both cases all page information is used to mark high |LLR| bits within the codeword, which improves capability.

FIG. 5A depicts an example read state for a soft decode operation, in accordance with present implementations. As illustrated by way of example in FIG. 5A, an example read state 500A for a soft decode operation can include at least page read thresholds 510 and 520, a hard decoding threshold 530, soft decision thresholds 540A and 542A, outer voltage ranges. 550 and 552, lobe voltage ranges 560A and 562A, and soft voltage ranges 570A and 572A.

The page read thresholds 510 and 520 can correspond to voltage thresholds to read bit information from pages extrinsic to the bit data of the page of the read state 500A. For example, the read state 500A can correspond to a top page of a row of a memory block. Here, the page read thresholds 510 and 520 can correspond to voltage thresholds to respectively read bit information from an upper page and a middle page of the row of the memory block having the top page. In this example, the hard decoding threshold 530A can respond to a voltage threshold to read bit information from the top page of the row of the memory block. The hard decoding threshold 530A can correspond to a bit position to be read by a memory device during a read operation corresponding to a particular page at that bit position.

The soft decision thresholds 540A and 542A can correspond to soft information obtained from multiple reads around the hard decoding threshold 530A. A fast sampling of soft information can include performing as few as two additional reads. Each read can be made on either side of the hard decoding threshold 530. The outer voltage ranges 550 and 552 can include ranges outside voltage ranges corresponding to particular bits in the lobe voltage ranges 560A and 562A. For example, the outer voltage ranges 550 and 552 can correspond to voltage ranges for bit positions distinct from the bit position corresponding to the hard decoding threshold 530.

The lobe voltage ranges 560A and 562A can correspond to ranges of voltages bounded by one or more of the outer voltage ranges 550 and 552, and one or more of the soft decision thresholds 540A and 542A. Each of the lobe voltage ranges 560A and 562A can correspond to respective lobes having bit information as discussed herein, for example, with respect to FIGS. 3 and 4. The soft voltage ranges 570A and 572A can correspond to ranges of voltages bounded by the hard decoding threshold 530, and a respective one of the soft decision thresholds 540A and 542A. For example, a first bin corresponding to the outer voltage range 550 can include voltages below the page read threshold 510. For example, a second bin corresponding to the lobe voltage range 560A can include voltages between the page read threshold 510 and the soft decision threshold 540A. For example, a third bin corresponding to the soft voltage range 570A can include voltages between the soft decision threshold 540A and the decoding threshold 530. For example, a fourth bin corresponding to the soft voltage range 572A can include voltages between the soft decision threshold 542A and the decoding threshold 530. For example, a fifth bin corresponding to the lobe voltage range 562A can include voltages between the soft decision threshold 542A and the page read threshold 520. For example, a sixth bin corresponding to the outer voltage range 552 can include voltages above the page read threshold 520.

The page read thresholds 510 and 520, the hard decoding threshold 530, and the soft decision thresholds 540A and 542A can thus define a plurality of voltage ranges or "bins" corresponding to the hard decoding threshold 530. The memory device can assign an LLR to each of these bins based on one or more of the voltage threshold that bound each region, or based on a property of the voltage range or memory content of the memory device in that voltage range. Thus, using these read thresholds, soft information described by LLRs per bit can be computed, and soft decoding can be performed by the memory device.

FIG. 5B depicts an example down-shifted read state for a soft decode operation, in accordance with present implementations. As illustrated by way of example in FIG. 5B, an example down-shifted read state 500B for a soft decode operation can include at least a shifted decision threshold 530B, shifted soft decision thresholds 540B and 542B, shifted lobe voltage ranges 560B and 562B, and shifted soft voltage ranges 570B and 572B. The down-shifted read state 500B can correspond to a modification of the read state 500A subsequent to an ICI compensation applied to one or more of the decision thresholds 530A, 540A and 542A to generate one or more of the shifted decision threshold 530B and the shifted soft decision thresholds 540B and 542B.

The shifted decision threshold 530B can correspond to a voltage threshold having a voltage level lower than a voltage level of the hard decoding threshold 530A. For example, the shifted decision threshold 530B can be shifted by a fixed value, or a variable value. The variable value can be based, for example, on an estimated threshold that corresponds to thresholds correlated with an optimized error correction operation receiving the shifted decision threshold 530A and extrinsic page information as input to generate the shifted decision threshold 530B. For example, the shifted decision threshold 530B can be optimized to a particular value or a particular difference from the hard decoding threshold 530A based on a trained neural network as discussed herein. The shifted soft decision thresholds 540B and 542B can correspond to voltage thresholds having respective voltage levels lower than respective voltage levels of the soft decision thresholds 540A and 542A. For example, the shifted soft decision thresholds 540B and 542B can be shifted by a fixed value, or a variable value. The variable value can be based, for example, on an estimated threshold that corresponds to thresholds correlated with an optimized error correction operation receiving the shifted decision threshold 530A and extrinsic page information as input to generate the shifted soft decision thresholds 540B and 542B. For example, the soft decision thresholds 540B and 542B can be optimized to a particular value or a particular difference from the soft decision thresholds 540A and 542A based on a trained neural network as discussed herein.

The shifted lobe voltage ranges 560B and 562B can correspond to voltage ranges having respective boundaries and sizes different than the lobe voltage ranges 560A and 562A, based on boundaries defined by one or more of the shifted decision threshold 530B and the soft decision thresholds 540B and 542B. For example, the shifted lobe voltage ranges 560B and 562B can be decreased and increased by a fixed value, or a variable value. The variable value can be based, for example, on voltages values of the soft decision thresholds 540B and 542B. The shifted soft voltage ranges 570B and 572B can correspond to voltage ranges having respective boundaries different than the soft voltage ranges 570A and 572A, based on boundaries defined by one or more of the shifted decision threshold 530B and the soft decision thresholds 540B and 542B. For example, the shifted soft voltage ranges 570B and 572B can be decreased and increased by a fixed value, or a variable value. The variable value can be based, for example, on voltages values of one or more of the shifted decision threshold 530B and the soft decision thresholds 540B and 542B. The memory device can generate the shifted decision threshold 530B and the soft decision thresholds 540B and 542B based on the technical solution of reading page information for extrinsic pages of the row of the memory block during a read operation. Thus, this technical solution can apply extrinsic page information to estimate voltage thresholds corresponding to ICI compensation, to provide at least the technical improvement of improved error correction with soft decoding in addition to or in place of hard decoding during read operation of a memory device.

FIG. 5C depicts an example up-shifted read state for a soft decode operation, in accordance with present implementations. As illustrated by way of example in FIG. 5C, an example up-shifted read state 500C for a soft decode operation can include at least a shifted decision threshold 530C, a shifted decision threshold 530C, shifted soft decision thresholds 540C and 542C, shifted lobe voltage ranges 560C and 562C, and shifted soft voltage ranges 570C and 572C.

The shifted decision threshold 530C can correspond to a voltage threshold having a voltage level higher than a voltage level of the hard decoding threshold 530A. For example, the shifted decision threshold 530C can be shifted by a fixed value, or a variable value. The variable value can be based, for example, on an estimated threshold that corresponds to thresholds correlated with an optimized error correction operation receiving the shifted decision threshold 530A and extrinsic page information as input to generate the shifted decision threshold 530C. For example, the shifted decision threshold 530C can be optimized to a particular value or a particular difference from the hard decoding threshold 530A based on a trained neural network as discussed herein.

The shifted soft decision thresholds 540C and 542C can correspond to voltage thresholds having respective voltage levels higher than respective voltage levels of the soft decision thresholds 540A and 542A. For example, the shifted soft decision thresholds 540C and 542C can be shifted by a fixed value, or a variable value. The variable value can be based, for example, on an estimated threshold that corresponds to thresholds correlated with an optimized error correction operation receiving the shifted decision threshold 530A and extrinsic page information as input to generate the shifted soft decision thresholds 540C and 542C. For example, the soft decision thresholds 540C and 542C can be optimized to a particular value or a particular difference from the soft decision thresholds 540A and 542A based on a trained neural network as discussed herein.

The shifted lobe voltage ranges 560C and 562C can correspond to voltage ranges having respective boundaries and sizes different than the lobe voltage ranges 560A and 562A, based on boundaries defined by one or more of the shifted decision threshold 530C and the soft decision thresholds 540C and 542C. For example, the shifted lobe voltage ranges 560C and 562C can be decreased and increased by a fixed value, or a variable value. The variable value can be based, for example, on voltages values of the soft decision thresholds 540C and 542C. The shifted soft voltage ranges 570C and 572C can correspond to voltage ranges having respective boundaries different than the soft voltage ranges 570A and 572A, based on boundaries defined by one or more of the shifted decision threshold 530C and the soft decision thresholds 540C and 542C. For example, the shifted soft voltage ranges 570C and 572C can be decreased and increased by a fixed value, or a variable value. The variable value can be based, for example, on voltages values of one or more of the shifted decision threshold 530B and the soft decision thresholds 540C and 542C.

The memory device can generate the shifted decision threshold 530C and the soft decision thresholds 540C and 542C based on the technical solution of reading page information for extrinsic pages of the row of the memory block during a read operation. Thus, this technical solution can apply extrinsic page information to estimate voltage thresholds corresponding to ICI compensation, to provide at least the technical improvement of improved error correction with soft decoding in addition to or in place of hard decoding during read operation of a memory device. This technical solution can apply ICI compensation with multiple shift capabilities to achieve error correction accuracy greater than soft error correction with a single ICI compensation shift.

Figure 6A:
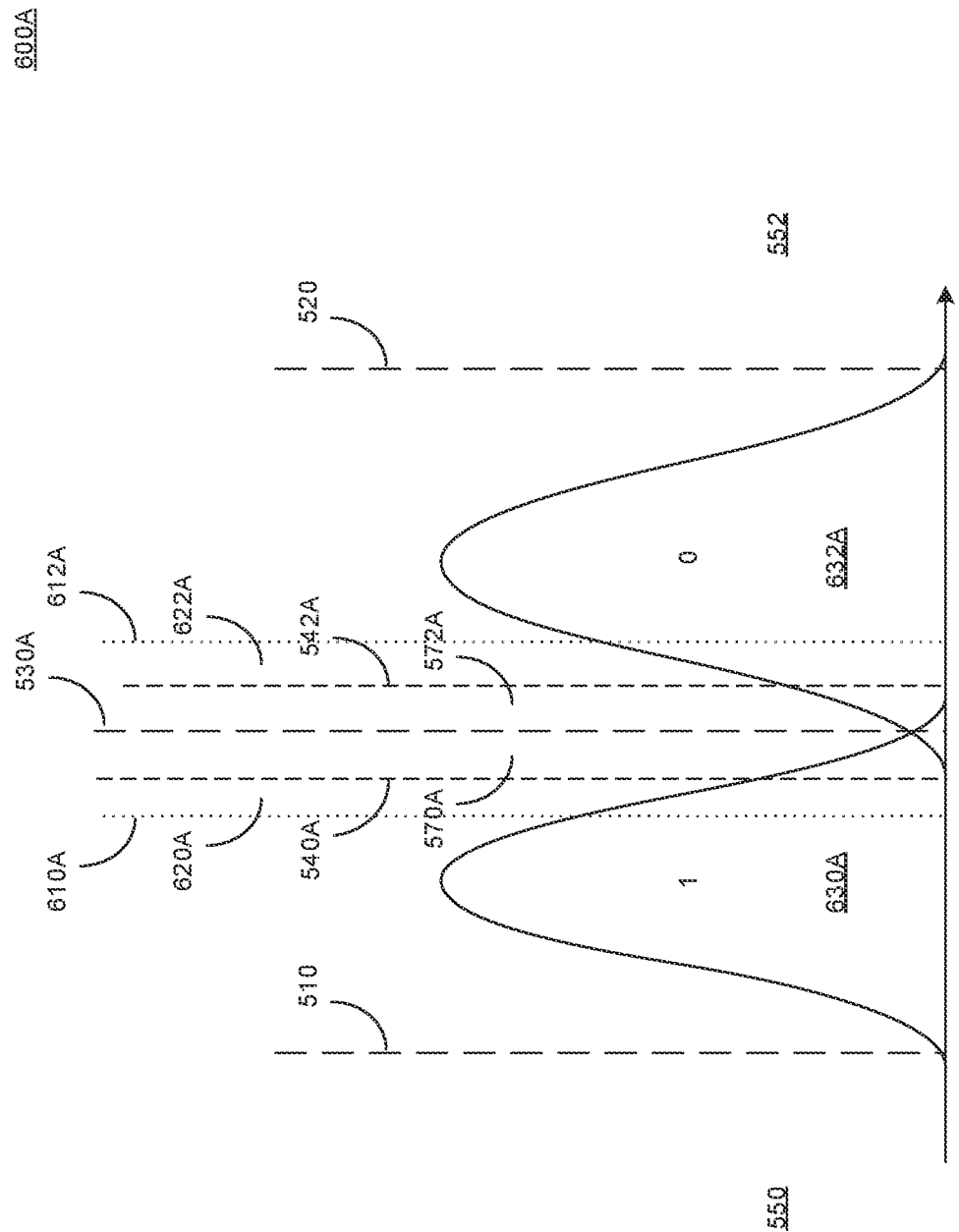
FIG. 6A depicts an example read state for an extended soft decode operation, according to some arrangements.
Figure 6C:
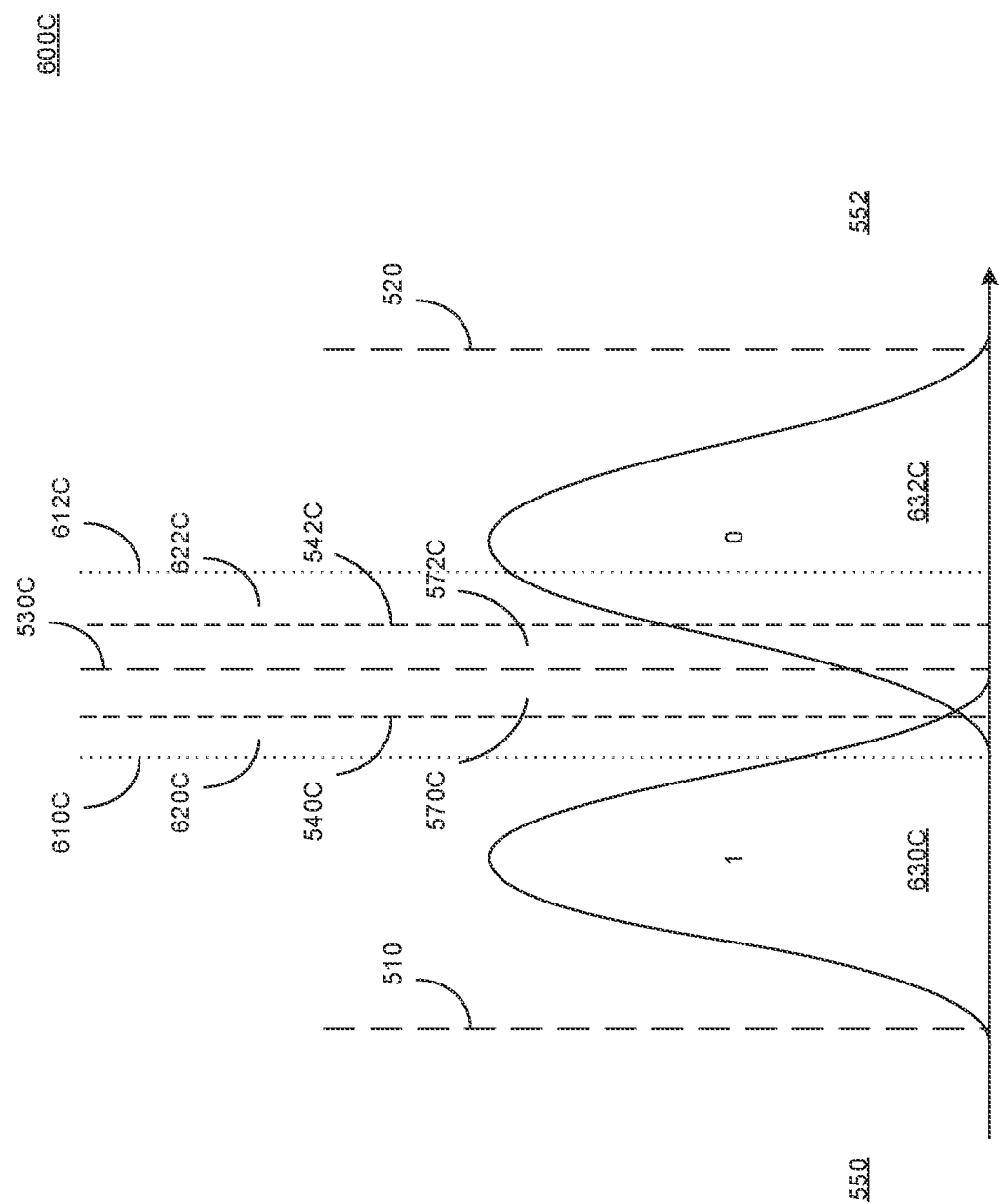
FIG. 6C depicts an example up-shifted read state for an extended soft decode operation, according to some arrangements.

FIGS. 6A-C are directed to ICI compensation with a single read of word line (WL) WL(n+1), and according to values of neighboring cells, to perform a compensation. For example, the compensation can include two read operations of a target row, with shifts that enable ICI reduction. For example, soft decoding can be performed without additional read operations dedicated to soft decoding. For example, the memory device can perform soft decoding by assigning LLRs to bits associated with read states 500B and 500C. Thus, sampling can be hard input for a first portion of the codeword bits. Sampling can correspond a 4 level LLR value for the second portion of codeword bits. For example, a first portion and a second portion can correspond to respective halves of a codeword. Table 1 shows an example of LLR assignment around the post ICI cancellation thresholds.

TABLE 1

| Bin Index | State0 | State1 |
| --- | --- | --- |
| 0 | −30 | −30 |
| 1 | −5 | −8 |
| 2 | 2 | −4 |
| 3 | 4 | −2 |
| 4 | 8 | 5 |
| 5 | 30 | 30 |

Here, for example, a bin index can correspond to a particular range as discussed herein. For example, bins 0, 1, 2, 3, 4 and 5 can respectively correspond to the first, second, third, fourth, fifth and sixth ranges as discussed in read state 500A. For example, this technical solution can provide a technical improvement for a code rate of 0.9 (4 KB) with soft 2-bit (SB2) decoding, where extrinsic page information at or above 50% reliability is available.

FIG. 6A depicts an example read state for an extended soft decode operation, in accordance with present implementations. As illustrated by way of example in FIG. 6A, an example read state for an extended soft decode operation 600A can include at least an extended soft decision thresholds 610A and 612A, an extended soft voltage ranges 620A and 622A, and lobe voltage ranges 630A and 632A.

The extended soft decision thresholds 610A and 612A can correspond to soft information obtained from multiple reads around the soft decision thresholds 540A and 542A. A fast sampling of soft information can include performing two additional reads beyond the reads of the read states 500A-C. Each additional read can be made on either side of the soft decision thresholds 540A and 542A. The extended soft decision thresholds 610A and 612A can correspond to voltage thresholds having voltage levels respectively lower and higher than voltage levels of the soft decision thresholds 540A and 542A. For example, the extended soft decision thresholds 610A and 612A can be obtained by read operations performed by the memory device with respect to one or more extrinsic pages. For example, the soft decision thresholds 540B and 542B can be optimized to a particular value or a particular difference from the soft decision thresholds 540A and 542A based on a trained neural network as discussed herein.

The extended soft voltage ranges 620A and 622A can correspond to ranges of voltages bounded by a respective one of the soft decision thresholds 540A and 542A, and an adjacent respective one of the extended soft decision thresholds 610A and 612A. For example, a first bin corresponding to the outer voltage range 550 can include voltages below the page read threshold 510. For example, a second bin corresponding to the lobe voltage range 630A can include voltages between the page read threshold 510 and the extended soft decision threshold 610A. For example, a third bin corresponding to the extended soft voltage range 620A can include voltages between the extended soft decision threshold 610A and the soft decision threshold 540A. For example, a fourth bin corresponding to the soft voltage range 570A can include voltages between the soft decision threshold 540A and the decoding threshold 530. For example, a fifth bin corresponding to the soft voltage range 572A can include voltages between the soft decision threshold 542A and the decoding threshold 530. For example, a sixth bin corresponding to the extended soft voltage range 622A can include voltages between the extended soft decision threshold 612A and the soft decision threshold 542A. For example, a seventh bin corresponding to the lobe voltage range 632A can include voltages between the soft decision threshold 542A and the page read threshold 520. For example, an eighth bin corresponding to the outer voltage range 552 can include voltages above the page read threshold 520.

The lobe voltage ranges 630A and 632A can correspond to ranges of voltages bounded by one or more of the outer voltage ranges 550 and 552, and one or more of the extended soft voltage ranges 620A and 622A. Each of the lobe voltage ranges 630A and 632A can correspond to respective lobes having bit information as discussed herein, for example, with respect to FIGS. 3 and 4, and can include a range corresponding to respective subsets of lobe voltage ranges 560A and 562A.

FIG. 6B depicts an example down-shifted read state for an extended soft decode operation, in accordance with present implementations. As illustrated by way of example in FIG. 6B, an example down-shifted read state for an extended soft decode operation 600B can include at least shifted extended soft decision thresholds 610B and 612B, shifted extended soft voltage ranges 620B and 622B, and shifted lobe voltage ranges 630B and 632B.

The shifted extended soft decision thresholds 610B and 612B can correspond to voltage thresholds having respective voltage levels lower than respective voltage levels of the extended soft decision thresholds 610A and 612A. For example, the shifted extended soft decision thresholds 610B and 612B can be shifted by a fixed value, or a variable value. The variable value can be based, for example, on an estimated threshold that corresponds to thresholds correlated with an optimized error correction operation receiving the shifted decision threshold 530A and extrinsic page information as input to generate the shifted extended soft decision thresholds 610B and 612B. For example, the shifted extended soft decision thresholds 610B and 612B can be optimized to a particular value or a particular difference from the extended soft decision thresholds 610A and 612A based on a trained neural network as discussed herein.

The shifted extended soft voltage ranges 620B and 622B can correspond to voltage ranges having respective boundaries different than the soft voltage ranges 620A and 622A, based on boundaries defined by one or more of the shifted extended soft voltage ranges 620B and 622B and the soft decision thresholds 540B and 542B. For example, the shifted extended soft voltage ranges 620B and 622B can be respectively decreased by a fixed value, or a variable value. The variable value can be based, for example, on voltages values of one or more of the shifted decision threshold 530B and the soft decision thresholds 540B and 542B. The memory device can generate the shifted extended soft voltage ranges 620B and 622B based on the technical solution of reading page information for extrinsic pages of the row of the memory block during a read operation distinct from a read operation corresponding to state 500. Thus, this technical solution can apply extrinsic page information to estimate voltage thresholds corresponding to extended ICI compensation, to provide at least the technical improvement of improved error correction with extended soft decoding in addition to or in place of soft decoding during read operation of a memory device.

The shifted lobe voltage ranges 630B and 632B can correspond to voltage ranges having respective boundaries and sizes different than the lobe voltage ranges 630A and 632A, based on boundaries defined by one or more of the shifted extended soft voltage ranges 620B and 622B and the shifted soft decision thresholds 540B and 542B. For example, shifted lobe voltage ranges 630B and 632B can be decreased and increased by a fixed value, or a variable value. The variable value can be based, for example, on voltages values of the shifted extended soft decision thresholds 610B and 612B.

FIG. 6C depicts an example up-shifted read state for an extended soft decode operation, in accordance with present implementations. As illustrated by way of example in FIG. 6C, an example up-shifted read state for an extended soft decode operation 600C can include at least shifted extended soft decision thresholds 610C and 612C, shifted extended soft voltage ranges 620C and 622C, and shifted lobe voltage ranges 630C and 632C.

The shifted extended soft decision thresholds 610C and 612C can correspond to voltage thresholds having respective voltage levels higher than respective voltage levels of the extended soft decision thresholds 610A and 612A. For example, the shifted extended soft decision thresholds 610C and 612C can be shifted by a fixed value, or a variable value. The variable value can be based, for example, on an estimated threshold that corresponds to thresholds correlated with an optimized error correction operation receiving the shifted decision threshold 530A and extrinsic page information as input to generate the shifted extended soft decision thresholds 610C and 612C. For example, the shifted extended soft decision thresholds 610C and 612C can be optimized to a particular value or a particular difference from the extended soft decision thresholds 610A and 612A based on a trained neural network as discussed herein.

The shifted extended soft voltage ranges 620C and 622C can correspond to voltage ranges having respective boundaries different than the soft voltage ranges 620A and 622A, based on boundaries defined by one or more of the shifted extended soft voltage ranges 620C and 622C and the soft decision thresholds 540B and 542B. For example, the shifted extended soft voltage ranges 620C and 622C can be respectively increased by a fixed value, or a variable value. The variable value can be based, for example, on voltages values of one or more of the shifted decision threshold 530C and the soft decision thresholds 540C and 542C. The memory device can generate the shifted extended soft voltage ranges 620C and 622C based on the technical solution of reading page information for extrinsic pages of the row of the memory block during a read operation distinct from a read operation corresponding to state 500. Thus, this technical solution can apply extrinsic page information to estimate voltage thresholds corresponding to extended ICI compensation, to provide at least the technical improvement of improved error correction with extended soft decoding in addition to or in place of soft decoding during read operation of a memory device.

The shifted lobe voltage ranges 630C and 632C can correspond to voltage ranges having respective boundaries and sizes different than the lobe voltage ranges 630A and 632A, based on boundaries defined by one or more of the shifted extended soft voltage ranges 620C and 622C and the shifted soft decision thresholds 540C and 542C. For example, shifted lobe voltage ranges 630C and 632C can be decreased and increased by a fixed value, or a variable value. The variable value can be based, for example, on voltages values of the shifted extended soft decision thresholds 610C and 612C.

Thus, the memory device can achieve the technical improvement of high accuracy and low latency error correction, by the technical solution of soft decoding with as few as three read operations and ICI compensation that results in non-symmetric soft sampling. For example, if two more reads are allowed, error correction capability can be considerably improved as illustrated in Table 2.

TABLE 2

| Read Flow Type (% Page Information Available) | Number of Read Operations | Error Correction Gain |
| --- | --- | --- |
| Hard Decoding | 1 | — |
| Hard Decoding | 2 | 43% |
| Soft Decoding (25%) | 0 | 79% |
| Soft Decoding (50%) | 0 | 90% |
| Extended Soft Decoding (50%) | 2 | 143% |

The memory device can generate the extended soft decision thresholds 610 and 612 based on the technical solution of reading page information for extrinsic pages of the row of the memory block during a read operation distinct from a read operation corresponding to soft decision thresholds 540 and 542. Thus, this technical solution can apply extrinsic page information to estimate voltage thresholds corresponding to extended ICI compensation, to provide at least the technical improvement of improved error correction with extended soft decoding in addition to or in place of soft decoding according to state 500 during read operation of a memory device. This technical solution can apply extended ICI compensation with multiple shift capabilities to achieve error correction accuracy greater than extended soft error correction with a single ICI compensation shift and soft error correction with multiple ICI compensation shifts.

Figure 7:
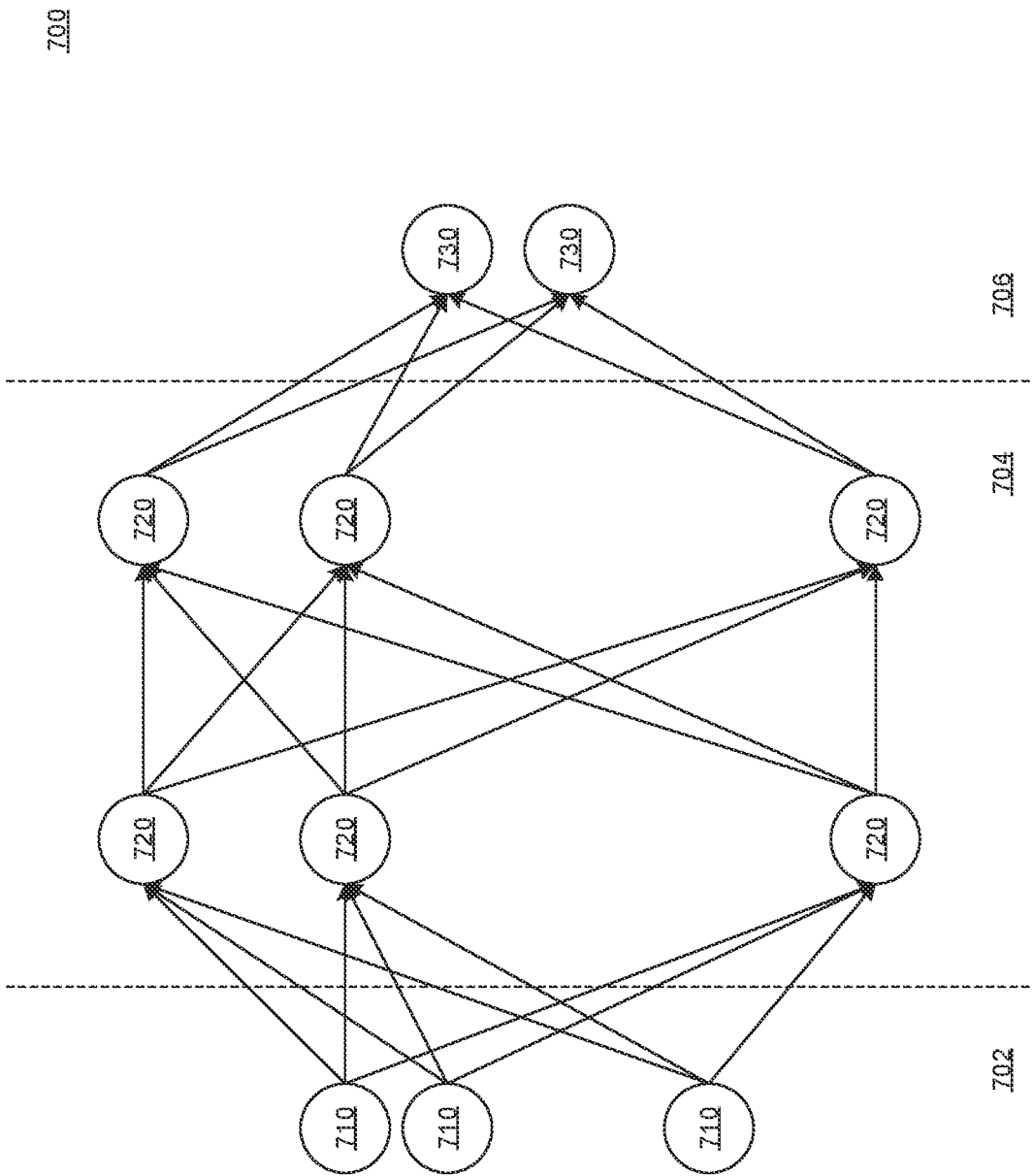
FIG. 7 depicts an example neural network architecture for soft decoding, according to some arrangements.

FIG. 7 depicts an example neural network architecture for soft decoding, in accordance with present implementations. As illustrated by way of example in FIG. 7, an example neural network architecture 700 for soft decoding can include at least an input layer 702, a hidden layer 704, and an output layer 706.

The input layer 702 can obtain one or more input features. The input layer 702 can include page information input nodes 710 each configured to obtain an input feature. For example, the DNN can obtain input features including a vector $\underline{H}$ including page information and ICI based histogram. For example, the DNN can obtain input features including a vector $\underline{P}$ including additional features. For example, current thresholds can be used for histogram computation, physical row number, program/erase cycle count, no-ICI commonly estimated thresholds. The vector $\underline{P}$ may contain all these features, or only some of them, as these may be available information for the controller during a read operation.

The hidden layer 704 can correlate input features input at the input layer 702 into output features generated at the output layer 706. The hidden layer 704 can include hidden layer nodes 720. The hidden layer nodes 720 can correspond to or include a multi-layer perceptron (MLP) network. The MLP can estimate accurately one or more voltage thresholds using input including the one or more all-page reads, including extrinsic page information, current read thresholds and ICI read results. The DNN input features can include one or more computed histograms each derived from page information and ICI reads.

The output layer 706 can generate one or more output features based on output of the hidden layer 704 via one or more of the hidden layer nodes 720. The output layer 706 can include threshold output nodes 730. For example, a DNN for threshold estimation can generate multiple output features. The threshold output nodes 730 can generate one or more neural network outputs including estimated read thresholds corresponding to one or more of the voltage thresholds and shifted voltage thresholds at least as discussed in 500A-C and 600A-C. For example, the estimated read thresholds $\hat{V}_{2D}$ for ICI compensation can be obtained from a deep-neural network corresponding to the neural network architecture 700.

Figure 8:
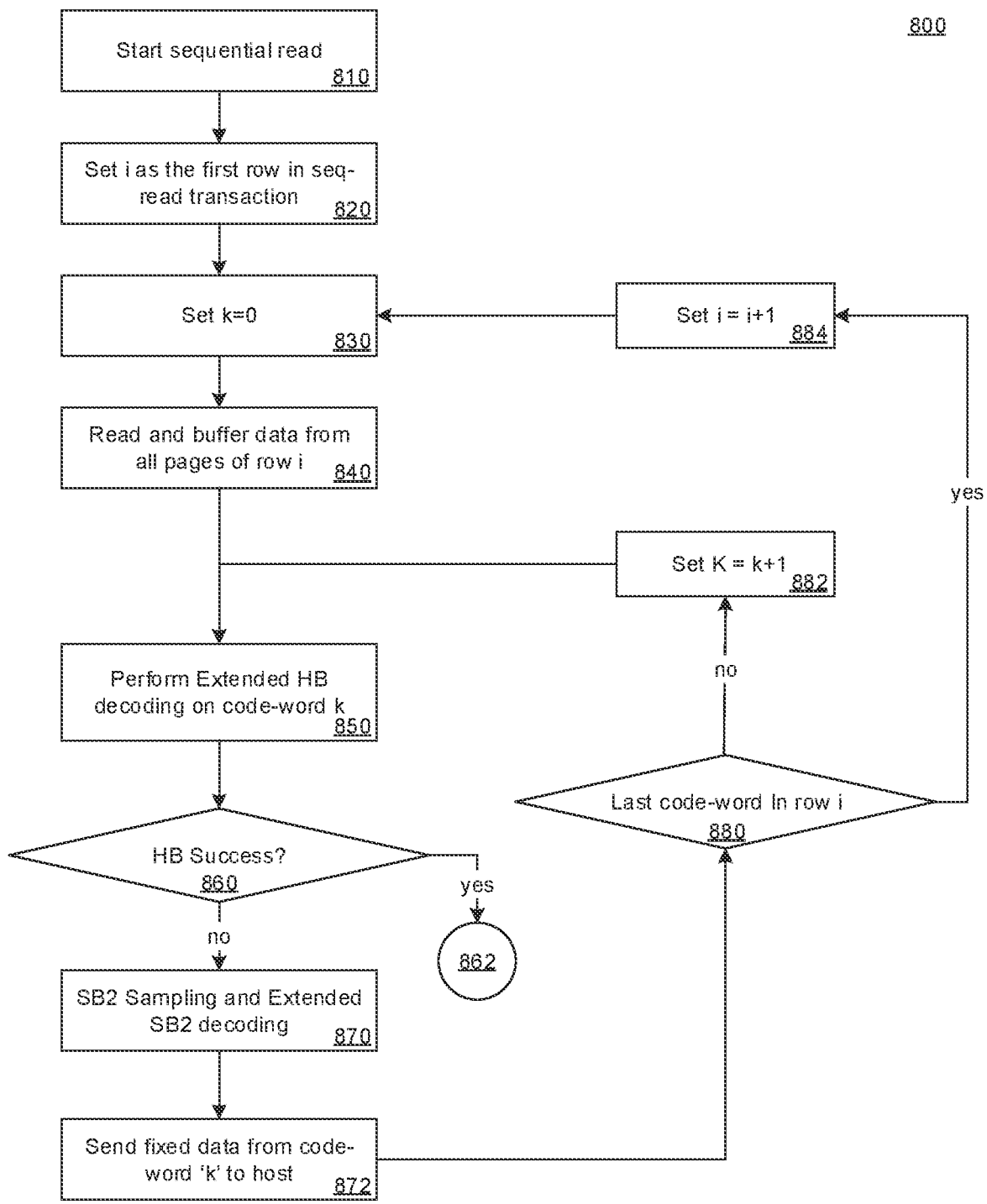
FIG. 8 depicts an example method of soft decoding for correcting errors in data storage devices, according to some arrangements.
Figure 9:
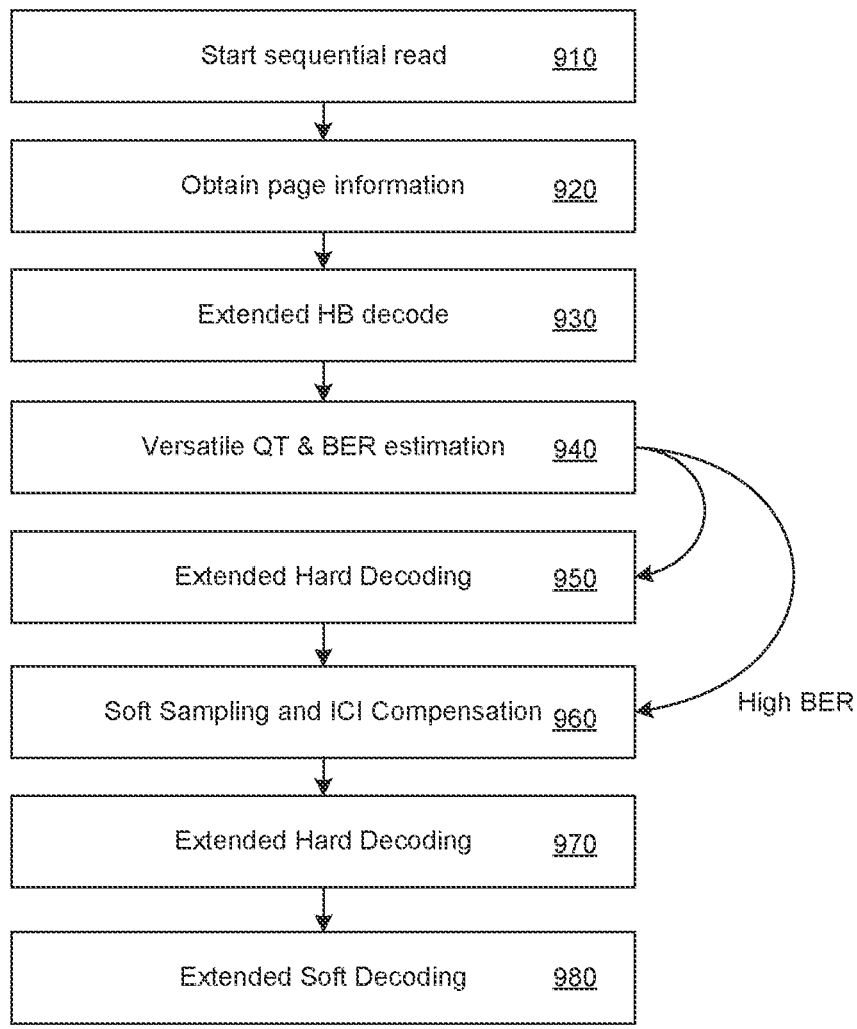
FIG. 9 depicts an example method of soft decoding for correcting errors in data storage devices, according to some arrangements.
Figure 10:
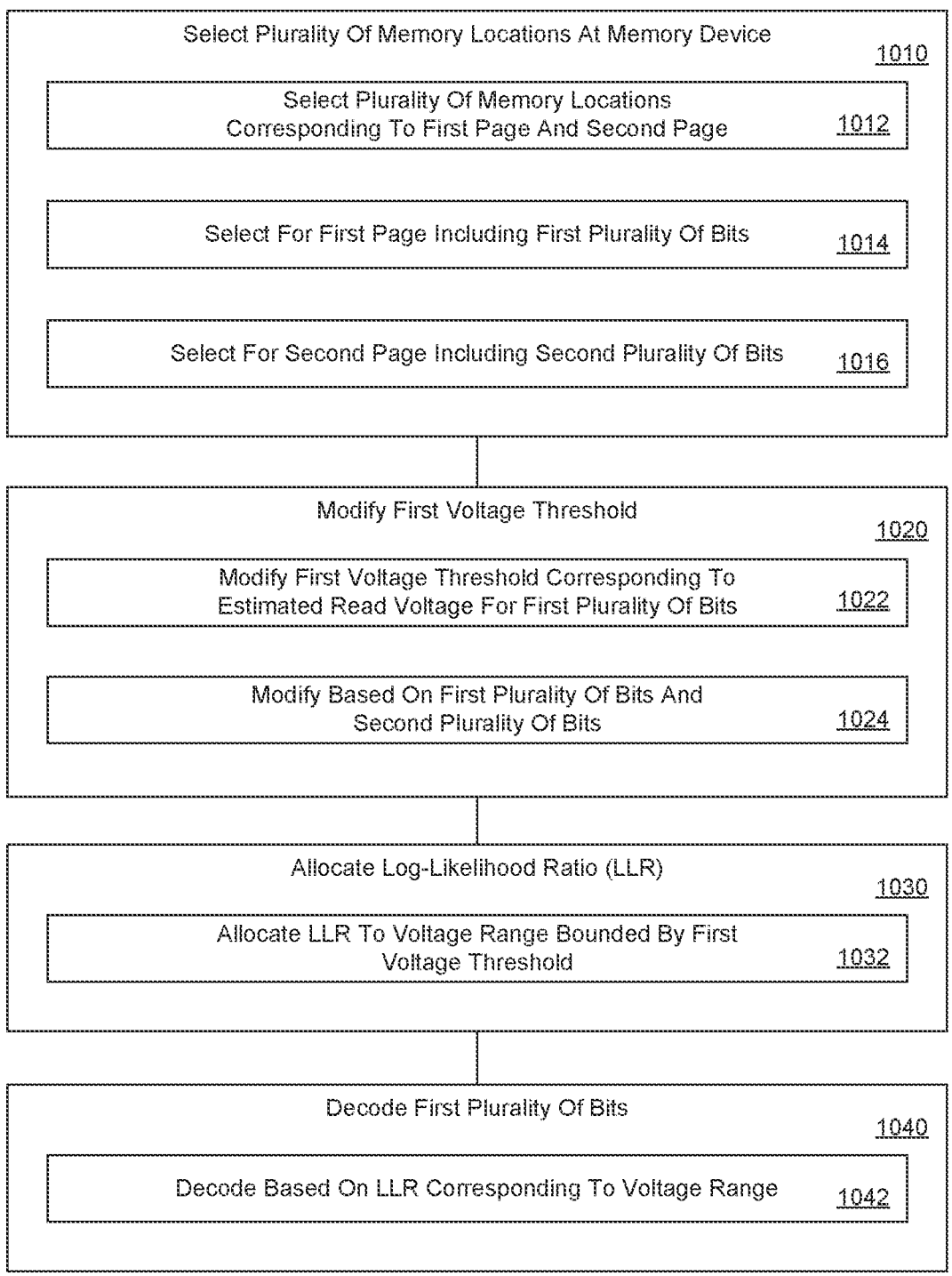
FIG. 10 depicts an example method of soft decoding for correcting errors in data storage devices, according to some arrangements.

FIG. 8 depicts an example method of soft decoding for correcting errors in data storage devices, in accordance with present implementations. At least controller 110 or controller 202 can perform method 800. The flow can include buffering of pages from a target row, and subsequently performing extended hard decoding. The methods of FIGS. 8-10 are not mutually exclusive, and can include portions of corresponding methods and portions of corresponding operations as discussed herein.

TABLE 3

| Read Flow Stage | Number of reads | Read Type | Description | Stage Output |
|---|---|---|---|---|
| Store previous pages of undecoded same row | | | Before decoding target page, buffer other pages of same row during the sequential transaction, in order to provide extended reliability information for target page | |
| Default read and Extended HB decode | 1 | Full page | Read target page, and use other pages to apply a labeling operation for marking high reliability bits, then perform HB decoding using the reliability info. | Success or Failure Indication |
| Zero-overhead QT | 0 | | Compute an 8 bin mock histogram from all page information, and estimate (using also current thresholds shift information) the optimal thresholds - this can be done due to availability of all page information. | Next read thresholds |
| Read and Extended HB decode | 1 | Full page | Read page again with QT thresholds and perform extended HB decode using same reliability information from previous stage. | Success or Failure Indication |
| ICI1 sampling and labeling | 0.333 | SLC | Perform read of WL(n + 1) and set fixed or estimated DAC shift compensation oer ICI state. This is used for all pages on same row, therefore it's a single SLC read that is used for all row pages in the sequential transaction. Dynamic ICI compensation with zero-overhead QT can be performed for optimal ICI compensation. | ICI1 shift estimation |
| ICI1 reads and labeling & extended HB decode | 2 | Full page | Perform ICI compensation and extended HB decoding. Perform HB decoding. | Success or Failure Indication |
| Extended soft decode | 0 | N/A | Using all available reads and all pages information to compute LLRs and provide soft information for decoding. Then extended soft decoding attempt. | Success or Failure Indication |
| Additional SB sampling & Decoding | 2 | Full page | Perform SB2 sampling with additional 2 reads with fixed shifts relative to QT thresholds. Combine with existing ICI1 buffers, all pages information, and perform | Success or Failure Indication |

TABLE 3-continued

| Read Flow Stage | Number of reads | Read Type | Description | Stage Output |
|---|---|---|---|---|
| SB5 decoding flow | 31 | Full page | labeling to obtain LLRs. Extended Soft decoding. High resolution sampling with additional pre-soft tracking, and high resolution LLR computation. Perform soft decoding | Success or Failure Indication |
| Max. total reads | 37.33 | | | |

Table 3 can correspond to a sequence as discussed herein with respect t at least to method 800. At 810, the method 800 can start a sequential read. At 820, the method 800 can set i as the first row in a sequential read transaction. At 830, the method 800 can initialize k. For example, the method 800 can initialize k to a starting value of 0. At 840, the method 800 can read and buffer data from all pages of row i. The buffering is not limited to all pages, and can include buffering of one or more pages in row I, including but not limited to a subset of all pages in row i. At 850, the method 800 can perform extended hard decoding on a kth codeword to fix one or more errors in that codeword.

At 860, the method 800 can determine whether HB decoding is successful. At 862, in response to a determination that hard decoding is successful, the method 800 can end decoding. At 870, in response to a determination that hard decoding is not successful, the method 800 can perform soft decoding and extended soft decoding. Soft decoding and extended soft decoding can include, for example SB2 sampling and decoding. At 872, the method 800 can send fixed data from the kth codeword to the host 101. At 880, the method 800 can determine if iteration has reached the last codeword in row i. At 882, in response to a determination that iteration has not reached the last codeword in row i, the method 800 can increment k. At 884, in response to a determination that iteration has reached the last codeword in row i, the method 800 can increment i.

FIG. 9 depicts an example method of soft decoding for correcting errors in data storage devices, in accordance with present implementations. At least controller 110 or controller 202 can perform method 900. At 910, the method 900 can start a sequential read. An example sequential read command from host implementation according to embodiments is described.

At 920, the method 900 can obtain page information. For example, the pages of a target row can be buffered, and used for providing reliability information for decoding using a simple labeling operation. The first stage in this flow can include buffering of pages extrinsic to a target page, followed by as few as one read operation of a target page using default thresholds read or by using a history table (HT) for the read thresholds. At 930, the method 900 can perform extended hard decoding. Then extended hard decoding can use page information of reliable bits to reduce false correction, and to achieve a technical improvement of faster decoding.

At 940, the method 900 can perform versatile QT and can perform BER estimation. For example, the method 900 can, in response to a determination that hard decoding has failed to sufficiently correct errors in a codeword, the method 900 can perform a zero-overhead QT by computing histograms from target and extrinsic page information, and by using a thresholds estimator that receives the histogram of the buffered target and extrinsic page read information, and a current thresholds used for reading all pages. It may receive additional inputs such as target row number and block cycle count. The method 900 can perform the zero-overhead QT based on output of the neural network architecture 700. The technical solution can thus accurately estimate read thresholds via the availability of all page information, including extrinsic page information. This technical solution thus provides at least the technical improvements of higher decoding capability with no additional read operations, and threshold estimation capability with no additional read operations. The estimated thresholds are can thus be used both for reading and hard decoding.

Extended decoding with page information on sequential read flows can thus enable a zero-overhead QT using histogram and thresholds of current read thresholds. In addition, here a BER estimation is performed using this information. Not only read thresholds, but also BER is estimated. For example, the BER estimation is used for selection of next read-flow stage, corresponding to a classification of input BER into two categories for either low BER or high BER. In case of low BER, HB decoding can be performed, and in case of high BER the hard decoding can be skipped, and soft decoding performed.

At 950, the method 900 can perform extended HB decode. The reason for starting with extended hard decoding, is the lower latency of hard decoding. If HB fails, then extended soft decoding which uses all page information is performed without any additional reads.

At 960, the method 900 can perform ICI1 sampling and compensation. If hard decoding fails, then ICI compensation using a single reads of next WL can be performed, and ICI compensation as explained earlier is performed before providing the decoder a BER reduced hard input. The ICI compensation can be a fixed shift, or it can be a dynamic shift which is estimated according to embodiments of this invention, this is explained in further elaboration below. At 970, the method 900 can perform extended HB decode. The method can perform hard decoding based on the BER reduced hard input generated at 960.

At 980, the method 900 can perform extended sb2 decode. In response to a determination that the non-symmetric SB2 has failed, additional two reads for SB2 can be performed and extended soft decoding can be attempted using the same information of extrinsic pages as high reliability information. The extended soft decoding can correspond to the read states of 600A-C. If extended soft decoding fails, then ICI sampling and soft sampling are performed at higher resolution, and highest capability soft decoding is attempted.

FIG. 10 depicts an example method of soft decoding for correcting errors in data storage devices, in accordance with present implementations. At least controller 110 or controller 202 can perform method 1000.

At 1010, the method 1000 can select a plurality of memory locations at a memory device. For example, the memory location can correspond to a row of a memory block in accordance with one or more of FIGS. 3 and 4. At 1012, the method 1000 can select a plurality of memory locations corresponding to a first page and a second page. For example, a first page can correspond to a target page among a top, upper, middle, and lower page. For example, a second page can correspond to an extrinsic page among a top, upper, middle, and lower page other than a target page. At 1014, the method 1000 can select for a first page including a first plurality of bits. At 1016, the method 1000 can select a plurality of memory locations for a second page including a second plurality of bits. For example, a second plurality of bits can correspond to bits of an extrinsic page.

At 1020, the method 1000 can modify a first voltage threshold. For example, a first voltage threshold can correspond to one or more of the voltage thresholds 530, 540, 542, 610 and 612. At 1022, the method 1000 can modify a first voltage threshold corresponding to an estimated read voltage for the first plurality of bits. For example, the modifying can correspond to an up-shift or a down-shift of one or more of the voltage thresholds 530, 540, 542, 610 and 612 At 1024, the method 1000 can modify based on the first plurality of bits and the second plurality of bits.

At 1030, the method 1000 can allocate a log-likelihood ratio (LLR). For example, the method 1000 can allocate an LLR having a value based on output of the neural network architecture 700. At 1032, the method 1000 can allocate LLR to a voltage range bounded by the first voltage threshold. For example, a voltage range can correspond to one or more of the voltages ranges or bins discussed herein.

At 1040, the method 1000 can decode the first plurality of bits. For example, the method 1000 can decode the first plurality of bits, corresponding to bits of a target page of a row, by one or more of hard decoding, extended hard decoding, soft decoding, and extended soft decoding as discussed herein. At 1042, the method 1000 can decode based on the LLR corresponding to the voltage range.

Figure 11:
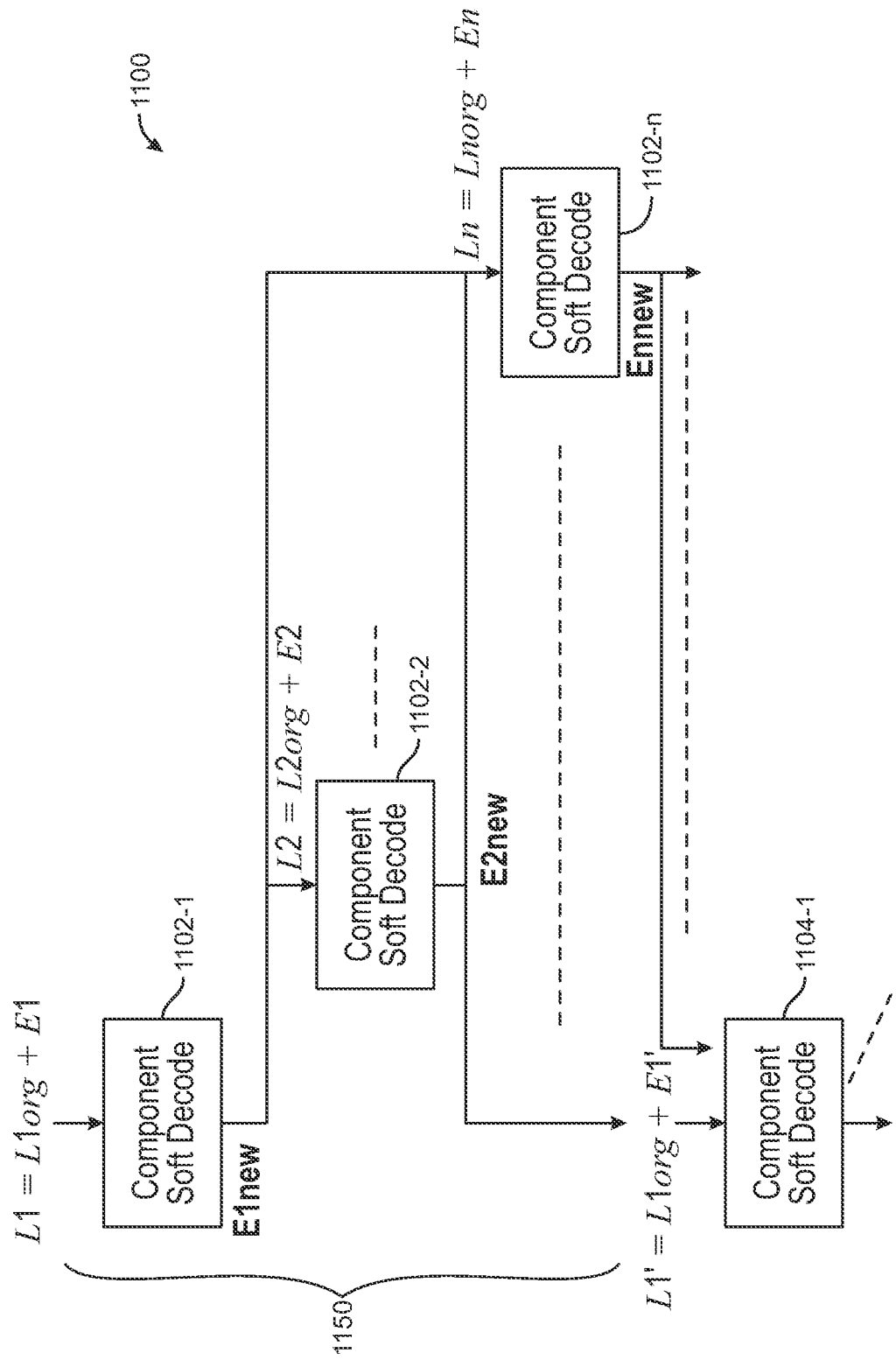
FIG. 11 is a flowchart illustrating an example methodology for sequential soft decoding of HFPC, according to some arrangements.

FIG. 11 is a flowchart illustrating an example methodology for sequential soft decoding of HFPC according to some arrangements. FIG. 11 shows an example sequential iterative soft decoding flow 1100. The flow 1100 may perform soft decoding iterations. For example, in a first iteration (S1150), the flow may perform soft decoding on each component code of n component codes (S1102-1, S1102-2, . . . , S1102-n) until a termination condition is reached. If the termination condition is not met, the flow may perform a second iteration by starting with soft decoding with a first component code (S1104-1).

In soft decoding a component code, a decoder (e.g., the ECC decoder 102 in FIG. 1) may take an LLR value as an input and calculate an extrinsic value as an output. Each (computed) LLR value can be expressed as the sum of (1) an intrinsic value and (2) an extrinsic value. The intrinsic value is available at the channel output before any decoding stage, and the extrinsic value is provided by exploiting the dependencies existing between the component being processed and the other component codes processed by the decoder. For example, in soft decoding a component code 1 (S1102-1), the decoder may input LLR value L1 which is expressed as the sum of (1) intrinsic value L1org and (2) extrinsic value E1, and output a new extrinsic value E1new. This new extrinsic value outputted at S1102-1 may affect decoding results of other component codes in their soft decoding steps (e.g., S1102-2 to S1102-n).

Now, a sequential iterative soft decoding of HFPC code will be described in more detail. In some arrangements, sequential iterative soft decoding may be performed to obtain high performance of soft decoding. In some arrangements, a decoder may perform the following three steps (Step 1, Step 2, and Step 3) for an iterative sequential decoding for HFPC. In Step 1, the decoder may create a list of unsolved component codes, e.g., by choosing components with a non-zero syndrome in BCH codes.

In Step 2, for each component for decoding, the decoder may perform the following sub-steps (a)-(d). In sub-step (a), the decoder may perform enumeration of hypothesis and solve every hypothesis e.g., using a BCH solver. In sub-step (b), for every valid candidate codeword C, the decoder may compute a score $S_{LLR}(C)$ according to Equation 12 described below. In sub-step (c), the decoder may save a best score $S_1$ and a second best score $S_2$, defined as follows (Equations 5, 6, and 7, respectively):

$$S_1 = \min_{C \in L} S_{LLR}(C), \quad (5)$$

$$C_{ML} = \operatorname*{argmin}_{C \in L} S_{LLR}(C), \text{ and} \quad (6)$$

$$S_2 = \min_{C \in L, C \neq C_{ML}} S_{LLR}(C), \quad (7)$$

where L is a valid codeword list, and $C_{ML}$ is a most likely codeword.

In sub-step (d), the decoder may compute an extrinsic value output for the component of the most likely codeword $C_{ML}$ based on the scores $S_1$ and $S_2$. The extrinsic value may be used to modify channel LLR values (e.g., intrinsic values) which are used by all other components in the following manner: (i) the LLR sign may be kept identical to input LLR sign; (ii) the LLR sign may be flipped on bit location specified in $C_{ML}$, and a sign vector of codeword may be updated (updated sign vector of codeword is denoted by $\underline{S}$); and/or (iii) extrinsic output vector $\underline{E}$ may be calculated or given by (Equation 8):

$$\underline{E} = e(S_1, S_2) \cdot \underline{S} \quad (8),$$

where e(S1,S2) is a scalar corresponding to the reliability associated with the maximal likelihood solution $C_{ML}$. $S_1$ and $S_2$ are from Equations 10 and 12, respectively, and correspond to the candidate codewords which have a best score (from Equation 10) and a second best score (from Equation 12).

In sub-step (d), the extrinsic output vector E of the target component may be added to channel input LLRs of corresponding bits, to be used by all other components which are dependent on that codeword in associated location.

In Step 3, as step 2 is applied to each component, the decoder may check termination (success) condition, after every component decoding is done. The decoder may repeat Steps 1-3 until success, or max-iteration count is reached (which means failure). These steps for sequential soft decoding are illustrated in FIG. 5, where the result of each component extrinsic values are fed to all other dependent components. In HFPC, all other components may be dependent and also benefit from the updated extrinsic values.

Figure 12:
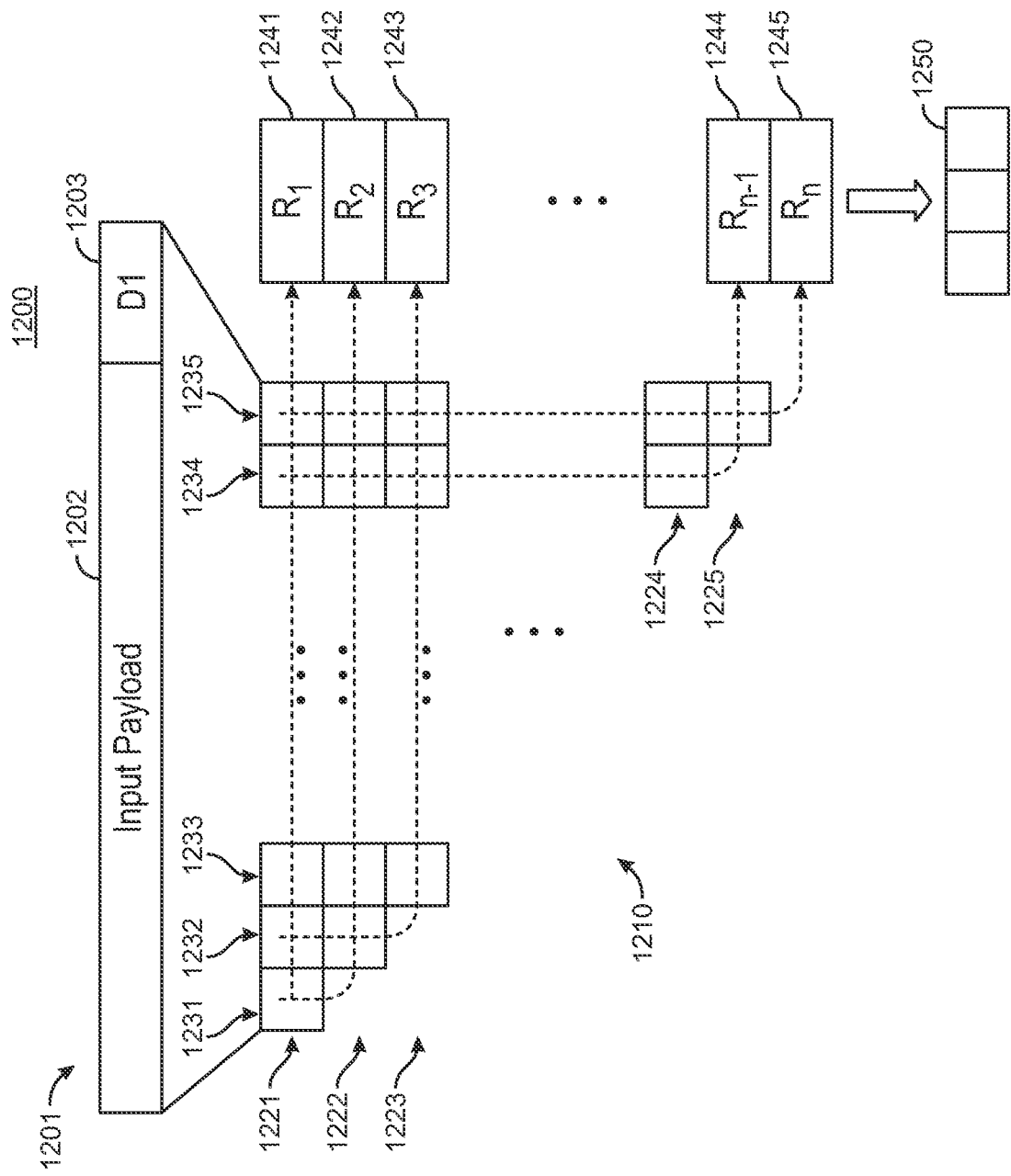
FIG. 12 is a diagram illustrating a mapping in an encoding process using a half folded-product code (HFPC) structure, according to some arrangements.
Figure 13:
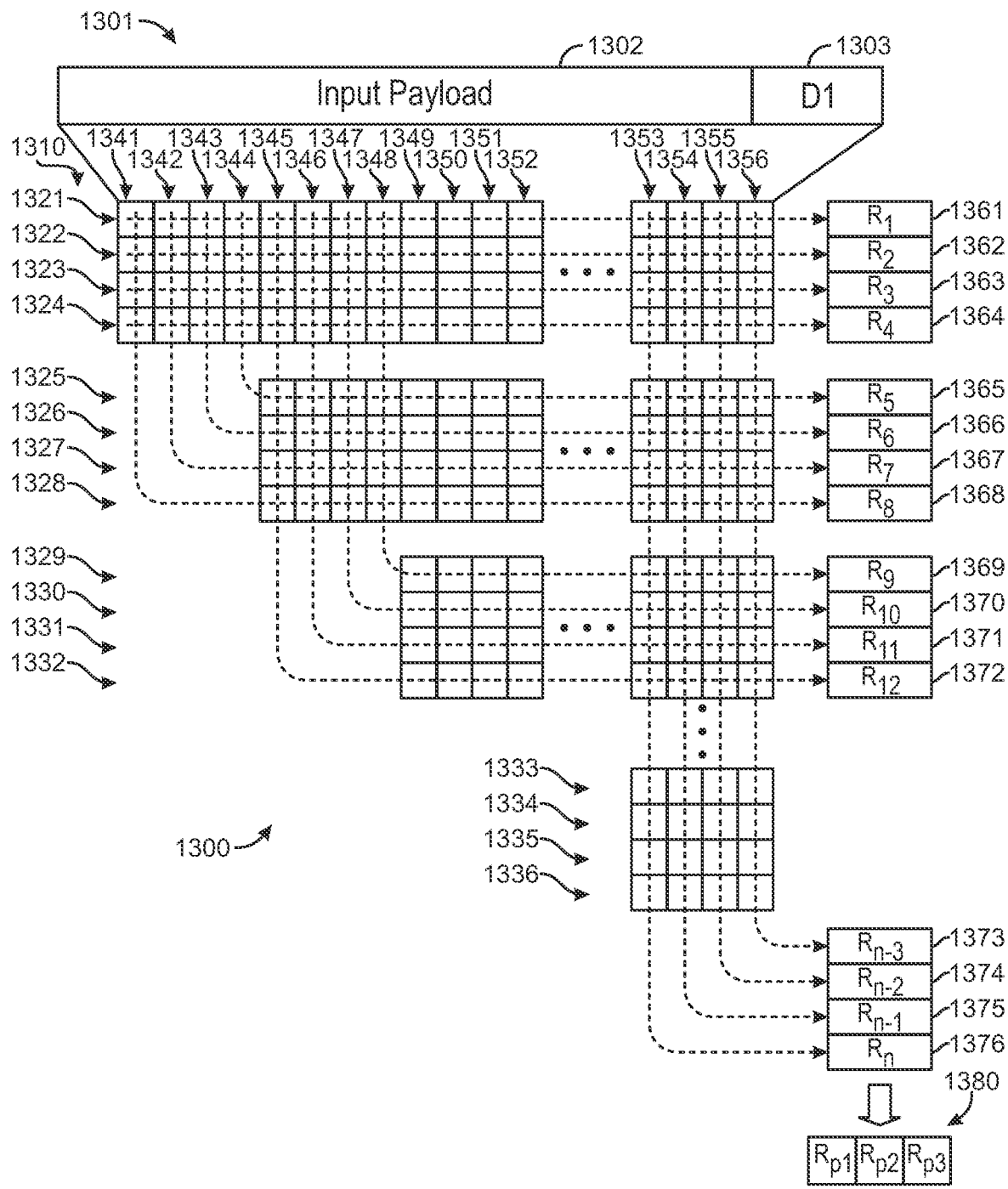
FIG. 13 is a diagram illustrating a mapping in an encoding process using a group HFPC structure, according to some arrangements.

FIG. 12 is a diagram illustrating a mapping 1200 in an encoding process using a HFPC structure according to various implementations. Referring to FIGS. 1 and 12-13, the mapping 1200 corresponds to the HFPC encoding scheme. The controller 110 (e.g., one or more ECC encoders of the ECC encoder/decoder 112) or the host 101 (e.g., one or more ECC encoders of the ECC encoder/decoder 102) can include or can otherwise implement an HFPC interleaver configured to organize (e.g., interleave or map) input bits 1201 into a form of a pseudo triangular matrix 1210. The input bits 1201 include input payload 1202 and signature bit(s) D1 1203 in some examples. The input payload 1202 includes the information bits. In some examples, the input payload 1202 includes information bits and redundancy bits introduced by the host 101 for RAID or erasure encoding (e.g., by the one or more ECC encoders of the ECC encoder/decoder 102). As described, an example of D1 1203 is the extra CRC bits. The bits of D1 1203 can also be referred to as "outer parity bits," given that CRC encoding can be viewed as an outer encoding process. The mapping from the input bits 1201 to the pseudo triangular matrix 1210 is maintained by the controller 110.

As shown, the pseudo triangular matrix 1210 has an upper triangular form, which has rows 1221-1225 (with rows between rows 1223 and 1224 omitted for clarity) and column 1231-1235 (with columns between columns 1233 and 1234 omitted for clarity). The pseudo triangular matrix 1210 is shown to have multiple blocks. Each block in the pseudo triangular matrix 1210 includes or otherwise represents two or more bits of the input bits 1201. The number of input bits per each block can be predetermined and equal for all the blocks of the pseudo triangular matrix 1210. Therefore, the HFPC is obtained by allowing any pair of component codes to encode (e.g., intersect at) more than one bit. Conventionally, any pair of components HFPC intersect by only one common (intersection) bit. The disclosed implementations allow intersection of two or more common bits for any pair of component codes. The pseudo triangular matrix 1210 is "pseudo" given that each row has two or more bits (e.g., a block) more than the row immediately below that row, and each column has two or more bits (e.g., a block) more than the column immediately to its left. Thus, each row or column of the pseudo triangular matrix differs from an adjacent row or column by two or more bits In some implementations, the input bits 1201 are mapped to a block in the pseudo triangular matrix 1210 consecutively (by any suitable order). For example, the rows 1221-1225, in that order or in a reverse order, can be filled by the input bits 1201 consecutively block by block, from the left-most block of a row to a right-most block of a row, vice versa. In another example, the columns 1231-1235, in that order or in a reverse order, can be filled by the input bits 1201 consecutively block by block, from the top-most block of a column to a bottom-most block of a row, vice versa. In some implementations, the input bits 1201 are mapped to the pseudo triangular matrix 1210 pseudo-randomly. In other implementations, the input bits 1201 can be mapped to the pseudo triangular matrix 1210 using another suitable mapping mechanism. In one arrangement, the mapping is a one to one mapping, where each bit of the input bits 1201 is mapped to one bit of the pseudo triangular matrix 1210 and the total number of bits in the pseudo triangular matrix 1210 is equal to the number of input bits 1201. In another arrangement, the mapping may be one to many, where each bit of the input bits 1201 is mapped to one or more bits of the pseudo triangular matrix 1210 and the total number of bits in the pseudo triangular matrix 1210 is greater than the number of input bits 1201.

As shown, the upper triangular form has a same number of columns and a same number of rows. In the upper triangular form, the row 1221 contains the most bits out of all the rows in the pseudo triangular matrix 1210. The row 1222 has one less block than the row 1221. The row 1223 has one less block than the row 1222, and so on. The row 1224 has two blocks, and the row 1225, being the lowest row, has one block. In other words, any row in the pseudo triangular matrix 1210 (except for the row 1221) has one block less than the row immediately above. Similarly, in the upper triangular form, the column 1231, being the left-most column, has one block. The column 1232 has one more block than the column 1231. The column 1233 has one more block than the column 1232, and so on. The column 1235, being the right-most column, has the most blocks out of the columns in the pseudo triangular matrix 1210. In other words, any column in the pseudo triangular matrix 1210 (except for the column 1235) has one block less than the column immediately to the right.

Organizing or mapping the input bits 1201 (which includes the bits of the input payload 1202 and signature bit(s) D1 1203) in the upper triangular form of the pseudo triangular matrix 1210 allows every component code to be associated with bits in a row and a column that have the same size or nearly the same size in the manner described. For example, R1 1241 represents redundancy bits corresponding to a first component code. R1 1241 redundancy bits are obtained by encoding (e.g., folded component encoding) the input bits 1201 in a first row (e.g., the bits in the row 1221). R2 1242 redundancy bits are obtained by encoding (e.g., via folded component encoding) the input bits 1201 in a first column (e.g., the bits in the column 1231) and the second row (e.g., the bits in the row 1222). The number of total bits (e.g., the bits in the column 1231 plus the bits in the row 1222) encoded by R2 1242 are the same as the number of total bits (e.g., the bits in the row 1221) encoded by R1 1241. R3 1243 redundancy bits are obtained by encoding (e.g., via folded component encoding) the input bits 1201 in a second column (e.g., the bits in the column 1232) and the third row (e.g., the bits in the row 1223). The number of total bits (e.g., the bits in the column 1232 plus the bits in the row 1223) encoded by R3 1243 are the same as the number of total bits encoded by R2 1242 (as well as the number of total bits encoded by R1 1241). This process continues to obtain the last redundancy bits Rn 1245, which encodes (e.g., via folded component encoding) the input bits 1201 in the last column (e.g., the bits in the column 1235). Thus, each component code encodes a row and a column in the pseudo triangular matrix 1210, providing folded component encoding. An example of the folded component encoding is folded BCH encoding.

In other words, according to the mapping 1200, the input bits 1201 are mapped to the component codes of the ECC and are encoded as the mapped component codes. For example, the encoding process organizes or maps the input bits 1201 into a matrix (e.g., the pseudo triangular matrix form), and performs folded BCH encoding for every component code. Each of the input bits 1201 is encoded by two component codes. Each component code intersects with all other component codes. For component codes that encode the input bits 1201, the encoding process is performed such that the systematic bits of every component code is also encoded by all other component codes. The input bits encoded by any of the component codes are also encoded by every other component code in the ECC in a non-overlapping manner.

For example, the bits encoded by the component code corresponding to R3 1243 redundancy bits are also encoded by other component codes corresponding to R1 1241, R2 1242, and R4-Rn 1245. The bits at intersection of the row 1221 and the column 1232 are also encoded by the component code corresponding to R1 1241; the bits at the intersection of the row 1222 and the column 1232 are also encoded by the component code corresponding to R2 1242; the bits at the intersection of the row 1223 and the column 1234 are also encoded by the component code corresponding to Rn−1 1244; the bits at the intersection of the row 1223 and the column 1235 are also encoded by the component code corresponding to Rn 1245. Each block of bits encoded by any of the component code (e.g., the component code corresponding to the R3 1243) is encoded by that component code (e.g., the component code corresponding to the R3 1243) and no more than another one of the component codes, hence in a non-overlapping manner. As such, every component code is mutually dependent on all other component codes. The component codes together provide the encoding of each of the input bits 1201 using two component codes. The component codes have the same code rate given that each component code encodes a same number of bits.

In some implementations, parity bits can be generated via parity encoding. For example, folded parity encoding can be used to encode at least a portion of each of R1 1241-Rn 1245 into another component code (e.g., a folded product code 1250, which is a set of packets). The folded product code 1250 is comprised of the parity bits. This method of generating the parity bits can be efficient for obtaining simple hardware encoding implementations of HFPC, as the method can be iteratively decoded using various methods of hard or soft decoding.

In some examples, to provide an efficient structure, an incomplete portion (e.g., not an entirety) of each of R1 1241-Rn 1245 is encoded to obtain the folded product code 1250. This is because only the encoded versions of the input bits 1201 (e.g., the input payload 1202) needs to be decoded—decoding all of the redundancy bits R1 1241-Rn 1245 may prolong decoding time.

In some arrangements, a number of component codes used for encoding the redundancy bits can change depending on code rate and intersection size needed for the redundancy bits. In some arrangements, the redundancy bits may not be encoded at all, resulting irregular degrees of protection for the bits within the codeword. The irregular degrees of protection can be useful in some cases in terms of its waterfall capability. In some arrangements, the degree of protection for some information bits can be more than two by leveraging irregular half folded-product code encoding. For example, in addition to encoding the regular half folded-product code as described with reference to FIGS. 12-13, an additional encoding process can be applied to some of the input bits 1201 by encoding those bits with a different set of component codes. In some examples, the irregularity of the encoding process is caused by some of the input bits 1201 being encoded by more than two component codes while other bits of the input bits 1201 are encoded by two component codes, creating an unequal error protection of the bits within the codeword and resulting in improved correction capabilities (as applied to iterative decoding).

The redundancy bits R1 1241-Rn-m 1245 generated from the HFPC encoding process described with respect to FIG. 12 can be encoded by another, separate set of component codes used to encode all or a subset of these redundancy bits by another set of component codes. This forms a folded product code encoding over the redundancy bits R1 1241-Rn-m 1245, which, together with the information bits encoding, results in a low complexity encoding process.

As shown, the bits for each component code depend on the bits for another component code during decoding in the ECC structure corresponding to the mapping 1200. For conventional half product codes, every pair of component codes has only one common (intersection) information bit. In some implementations, a HFPC is obtained by using every pair of component codes encode more than one information bit. Accordingly, there can be two or more common (intersection) bits for every pair of component codes. In some implementations, the redundancy bits generated from the HFPC encoding process described herein are encoded by a separate set of component codes. For example, the separate set of component codes encode all or a subset of the redundancy bits to form a folded product code that encodes over the redundancy bits, which together with the information bits encoding, results in a low complexity encoding process.

In some implementations, multiple component codes can be grouped together and function like a single element according to the HFPC structures such that no dependency exists among the bits of the component codes within each group of component codes. Such encoding scheme reduces dependency of the HFPC structure and enables faster decoding implementation in hardware given that the encoding scheme is a low-complexity encoding and decoding code structure obtained by defining groups, where each group includes independent components.

In that regard, FIG. 13 is a diagram illustrating a mapping 1300 in an encoding process using a group HFPC structure according to various implementations. Referring to FIGS. 1 and 12-13, the mapping 1300 corresponds to the group HFPC encoding scheme. The HFPC interleaver of controller 110 (e.g., one or more ECC encoders of the ECC encoder/decoder 112) or the host 101 (e.g., one or more ECC encoders of the ECC encoder/decoder 102) is configured to organize (e.g., interleave) input bits 1301 into a form of a pseudo triangular matrix 1310. The input bits 1301 includes input payload 1302 and signature bit(s) D1 1303 in some examples. The input payload 1302 includes the information bits. As described, an example of D1 1303 is the extra CRC bits (outer parity bits). The mapping from the input bits 1301 to the pseudo triangular matrix 1310 is maintained by the controller 110.

As shown, the pseudo triangular matrix 1310 has an upper triangular form, which has rows 1321-1336 (with rows between rows 1332 and 1333 omitted for clarity) and columns 1341-1356 (with columns between columns 1352 and 1353 omitted for clarity). The pseudo triangular matrix 1310 is shown to have multiple blocks. Each block in the pseudo triangular matrix 1310 includes or otherwise represents two or more bits of the input bits 1301. The number of input bits per each block can be predetermined and equal for all the blocks of the pseudo triangular matrix 1310. The disclosed implementations allow intersection of two or more common bits for any pair of component codes.

In some implementations, the input bits 1301 are mapped to blocks in the pseudo triangular matrix 1310 consecutively (by any suitable order). For example, the rows 1321-1336, in that order or in a reverse order, can be filled by the input bits 1301 consecutively block-by-block, from the left-most block of a row to a right-most block of a row, or vice versa. In another example, the columns 1341-1356, in that order or in a reverse order, can be filled by the input bits 1301 consecutively block-by-block, from the top-most block of a column to a bottom-most block of a row, or vice versa. In some implementations, the input bits 1301 are mapped to the pseudo triangular matrix 1310 pseudo-randomly. In other implementations, the input bits 1301 can be mapped to the pseudo triangular matrix 1310 using another suitable mapping mechanism.

The blocks, rows, and columns in the pseudo triangular matrix 1310 can be grouped together. For example, the pseudo triangular matrix 1310 includes a first group of columns 1341-1344, a second group of columns 1345-1348, a third group of columns 1349-1352, . . . , and another group of columns 1353-1356. The pseudo triangular matrix 1310 includes a first group of rows 1321-1324, a second group of rows 1325-1328, a third group of rows 1329-1332, . . . , and another group of rows 1333-1336. Thus, the HFPC structure is divided into groups of 13 component codes. Every 4 component codes are encoded according to HFPC guidelines. Although 4 component code groups (e.g., 4 rows/columns) are shown in FIG. 13, any number (e.g., 2, 3, 6, 8, 10, 12, 16, and so on) of component codes can be grouped together.

As shown, the upper triangular form has a same number of columns and a same number of rows. The rows (e.g., the rows 1321-1324) or columns (e.g., the columns 1341-1344) in a same component code group have a same number of blocks and therefore have a same number of bits. In the upper triangular form, the rows 1321-1324 contain the most bits out of all the rows in the pseudo triangular matrix 1310. Each of the rows 1325-1328 has one less group of blocks (4 blocks, corresponding to the group of columns 1341-1344) than any of the rows 1321-1324. Each of the rows 1329-1332 has one less group of blocks (4 blocks, corresponding to the group of columns 1345-1348) than any of the rows 1325-1328, and so on. Each of the rows 1333-1336, being the lowest row, has a group of blocks (e.g., 4 blocks). In other words, any row in the pseudo triangular matrix 1310 (except for the rows 1321-1324) has 4 blocks less than a row of a group immediately above. Similarly, in the upper triangular form, each of the columns 1341-1344, being one of the left-most columns, has a group of blocks (e.g., 4 blocks). Each of the columns 1345-1348 has one more group of blocks (4 blocks, corresponding to the group of rows 1325-1328) than any of the columns 1341-1344. Each of the columns 1349-1352 has one more group of blocks (4 blocks, corresponding to the group of rows 1329-1332) than any of the columns 1345-1348, and so on. Each of the columns 1353-1356, being the right-most columns, has the greatest number of blocks. In other words, any column in the pseudo triangular matrix 1310 (except for the columns 1353-1356) has 4 blocks less than a column of a group immediately to the right.

Organizing or mapping the input bits 1301 in the upper triangular form of the pseudo triangular matrix 1310 allows every component code to be associated with bits in a row and a column that have the same size or nearly the same size in the manner described. The component codes within a same group encode separate sets of the input bits 1301 and are independent of each other.

R1 1361-R4 1364 are redundancy bits determined based on a same group of component codes. R1 1361 represents redundancy bits corresponding to a first component code and are obtained by encoding (e.g., folded component encoding) the input bits 1301 in a first row (e.g., the bits in the row 1321). R2 1362, R3 1363, and R4 1364 represent redundancy bits corresponding to additional component codes and are obtained by encoding (e.g., folded component encoding) the input bits 1301 in the bits in the rows 1322, 1323, and 1323, respectively. The bits used to determine each of R1 1361-R4 1364 do not overlap, and thus R1 1361-R4 1364 are independently determined.

R5 1365, R6 1366, R7 1367, and R8 1368 represent redundancy bits corresponding to additional component codes and are obtained by encoding (e.g., folded component encoding) the input bits 1301 in the bits in the column 1344 and row 1325, in the column 1343 and row 1326, in the column 1342 and row 427, and in the column 1341 and row 1328, respectively. The bits used to determine each of R5 1365-R8 1368 do not overlap, and thus R5 1365-R8 1368 are independently determined.

R9 1369, R10 1370, R11 1371, and R12 1372 represent redundancy bits corresponding to additional component codes and are obtained by encoding (e.g., folded component encoding) the input bits 1301 in the bits in the column 1348 and row 1329, in the column 1347 and row 1330, in the column 1346 and row 1331, and in the column 1345 and row 1332, respectively. The bits used to determine each of R9 1369-R12 1372 do not overlap, and thus R9 1369-R12 1372 are independently determined.

This process continues until Rn−3 1373, Rn−2 1374, Rn−1 1375, and Rn 1376 are determined. Rn−3 1373, Rn−2 1374, Rn−1 1375, and Rn 1376 represent redundancy bits corresponding to additional component codes and are obtained by encoding (e.g., folded component encoding) the input bits 1301 in the bits in the column 1356, in the column 1355, in the column 1354, and in the column 1353, respectively. The bits used to determine each of Rn−3 1373, Rn−2 1374. Rn−1 1375, and Rn 1376 do not overlap, and thus Rn−3 1373, Rn−2 1374, Rn−1 1375, and Rn 1376 are independently determined. An example of the folded component encoding is folded BCH encoding. In the special case that the component codes are divided into two groups of independent component codes, the resulting coding scheme degenerates to a folded product code.

According to the mapping 1300, the input bits 1301 are mapped to the component codes of the ECC and are encoded as the mapped component codes. For example, the encoding process organizes or maps the input bits 1301 in a matrix (e.g., a pseudo triangular matrix form), and performs folded BCH encoding for every component code. Each of the input bits 1301 is encoded by two component codes of different component code groups. Thus, any component code intersects with all other component codes that are in the same group as the group to which that component code belongs. For component codes that encode the input bits 1301, the encoding process is performed such that the systematic bits of every component code is also encoded by all other component codes that belong to different groups, with dependency within a component code group being eliminated. The input bits encoded by a given component code of the component codes are also encoded by every other component code (that is not in the same group as that component code) in a non-overlapping manner. For example, the bits encoded by the component code corresponding to R9 1369 redundancy bits are also encoded by other component codes corresponding to R1 1361-R8 1368 and R11-Rn 1376 that are not in the group in which the component code corresponding to R9 1369 redundancy bits belongs. Each block of bits encoded by any of the component code (e.g., the component code corresponding to the R9 1369) is encoded by that component code (e.g., the component code corresponding to the R9 1369) and no more than another one of the component codes, hence in a non-overlapping manner. As such, every component code is mutually dependent on all other component codes that are not within the same group. The component codes together provide the encoding of each input bits 1301 using two component codes.

In some implementations, parity bits can be generated via parity encoding. For example, folded parity encoding can be used to encode at least a portion of each of R1 1361-Rn 1376 into another component code (e.g., a folded product code 1380, which is a set of packets). The folded product code 1380 (e.g., having Rp1-Rp3) is the parity bits. This method of generating the parity bits can be efficient for obtaining simple hardware encoding implementations of HFPC, as the method can be iteratively decoded using various methods of hard or soft decoding.

While a hard decoder decodes a message based on received bits (based on hard decision), soft input can be obtained by soft sampling, e.g., performing multiple reads from a flash device, where each read operation uses a different one of the read thresholds. The read thresholds can be configured such that soft information or soft metrics such as but not limited to, a log-likelihood ratio (LLR), can be computed per bit. An LLR is defined as (Equation 9):

$$LLR(b_i) = \log\left(\frac{P(b_i = 1|y)}{P(b_i = 0|y)}\right), \quad (9)$$

where y is a channel output and $b_i$ is the $i^{th}$ bit of a page. The LLR expression can be substantially simplified in some examples, for an additive white Gaussian noise (AWGN) channel model. The AWGN can be used to approximate lobes' distribution in a flash device. By assuming an AWGN channel (Equation 10):

$$P(b_i|y) = \frac{1}{\sqrt{2\pi\sigma^2}} \exp\left(-\frac{(y - b_i)^2}{2\sigma^2}\right), \quad (10)$$

where y is the AWGN channel output. Therefore, in some examples, the $LLR(b_i)$ becomes (Equation 11):

$$LLR(b_i) = \frac{2y}{\sigma^2}, \quad (11)$$

where the LLR per bit is created during multiple flash reads, as a quantized version of an AWGN channel. In some arrangements, the quantization level per threshold can be directly determined by the number of reads, as a base-two logarithm of a read counter.

After multiple reads have been conducted, and once LLRs are available for all codeword bits, a decoding process may begin. There can be many possible approximations for mapping of LLR values' for implementation efficiency, such as mapping to fixed point integer values. A product code corresponds to an n×n array in which each column and row is a codeword in component code. Several known decoding algorithms can be used for a product code when soft information is available to a decoder. The general approach includes decoding each component code separately to generate output reliabilities per bit, which is applied and used for iterative decoding of the component code. For example, soft decoding of a BCH component code needs soft information per bit. Iterative soft decoding includes a process of performing soft decoding on some of component codes, and applying the most likely corrections under different conditions. One approach for soft decoding is enumeration over low reliability bits, while trying to solve the BCH code per hypothesis. Other approaches include enumeration on least reliable bits together with assumptions that all errors are within a set of Q×t bits and performing erasure decoding, where t is the number of correctable bits (e.g., t=3), Q stands for the Galois field ($2^Q$) that is used for the code elements (e.g., Q=10). Q and t are parts of the parameters of the code, and Q×t is the number of parity bits of the codeword. This approach is known as ordered statistics decoding.

If the BCH component codes with decoding capability of t<4 are used, soft decoding can be efficiently implemented in terms of computational complexity, or implemented in hardware implementation, as per hypothesis a solution can directly be computed using a syndrome lookup table (LUT). Performing any type of soft decoding for a component code includes creating a list of candidates of the most likely error hypotheses for valid codeword corrections. A soft score for every result of valid codeword can be computed by (Equation 12):

$$S_{LLR} = \sum_{b_m \in C} |LLR(b_m)|, \quad (12)$$

where C is the set of error bits, and $b_m$ is a location of an error bit. In some examples, the selected error hypothesis of a soft component decoder has the smallest $S_{LLR}$ score.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout the previous description that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

It is understood that the specific order or hierarchy of steps in the processes disclosed is an example of illustrative approaches. Based upon design preferences, it is understood that the specific order or hierarchy of steps in the processes may be rearranged while remaining within the scope of the previous description. The accompanying method claims present elements of the various steps in a sample order, and are not meant to be limited to the specific order or hierarchy presented.

The previous description of the disclosed implementations is provided to enable any person skilled in the art to make or use the disclosed subject matter. Various modifications to these implementations will be readily apparent to those skilled in the art, and the generic principles defined herein may be applied to other implementations without departing from the spirit or scope of the previous description. Thus, the previous description is not intended to be limited to the implementations shown herein but is to be accorded the widest scope consistent with the principles and novel features disclosed herein.

The various examples illustrated and described are provided merely as examples to illustrate various features of the claims. However, features shown and described with respect to any given example are not necessarily limited to the associated example and may be used or combined with other examples that are shown and described. Further, the claims are not intended to be limited by any one example.

The foregoing method descriptions and the process flow diagrams are provided merely as illustrative examples and are not intended to require or imply that the steps of various examples must be performed in the order presented. As will be appreciated by one of skill in the art the order of steps in the foregoing examples may be performed in any order. Words such as "thereafter," "then," "next," etc. are not intended to limit the order of the steps; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm steps described in connection with the examples disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The hardware used to implement the various illustrative logics, logical blocks, modules, and circuits described in connection with the examples disclosed herein may be implemented or performed with a general purpose processor, a DSP, an ASIC, an FPGA or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some steps or methods may be performed by circuitry that is specific to a given function.

In some examples, the functions described may be implemented in hardware, software, firmware, or any combination thereof. If implemented in software, the functions may be stored as one or more instructions or code on a non-transitory computer-readable storage medium or non-transitory processor-readable storage medium. The steps of a method or algorithm disclosed herein may be embodied in a processor-executable software module which may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include RAM, ROM, EEPROM, FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

The preceding description of the disclosed examples is provided to enable any person skilled in the art to make or use the present disclosure. Various modifications to these examples will be readily apparent to those skilled in the art, and the generic principles defined herein may be applied to some examples without departing from the spirit or scope of the disclosure. Thus, the present disclosure is not intended to be limited to the examples shown herein but is to be accorded the widest scope consistent with the following claims and the principles and novel features disclosed herein.

What is claimed is:

1. A computer-implemented method of soft correction in a memory device, the computer-implemented method comprising:
   selecting a plurality of memory locations at a memory device, the memory locations corresponding to a first page including a first plurality of bits and a second page including a second plurality of bits;
   modifying, based on the first plurality of bits and the second plurality of bits, a first voltage threshold corresponding to an estimated read voltage for the first plurality of bits;
   allocating, to a voltage range bounded by the first voltage threshold, a log-likelihood ratio (LLR); and
   decoding, based on the LLR corresponding to the voltage range, the first plurality of bits.

2. The method of claim 1, further comprising:
   generating, based on the first plurality of bits and the second plurality of bits, a histogram corresponding to the first plurality of bits; and
   modifying, based on the first voltage threshold corresponding to the histogram, one or more of the first voltage threshold and the second voltage threshold, the voltage range bounded by the first voltage threshold and the second voltage threshold.

3. The method of claim 1, further comprising:
   modifying, based on the first voltage threshold and a second voltage threshold corresponding to a read operation of the first plurality of bits, one or more of the first voltage threshold and the second voltage threshold.

4. The method of claim 3, further comprising:
   obtaining, during a sequential read, one or more of extrinsic page information including the second page, the LLR and ICI information;
   generating a magnitude of the LLR in response to and based on one or more of a soft sampling operation, a voltage bounded by the voltage range, the second voltage threshold, the first plurality of bits, and the second plurality of bits, the LLR having a first confidence based on the first plurality of bits and the second plurality of bits greater than a second confidence based on the first plurality of bits and excluding the second plurality of bits.

5. The method of claim 3, the first voltage threshold corresponding to a first plurality of voltage thresholds, the second voltage threshold corresponding to a second plurality of voltage thresholds, and the voltage ranges corresponding to a plurality of voltage ranges between adjacent ones of the first plurality of voltage thresholds and the second plurality of voltage thresholds.

6. The method of claim 1, further comprising:
decoding, based on the first plurality of bits and the second plurality of bits, the first plurality of bits by hard decoding; and
modifying the first voltage threshold, in response to an indication of failure corresponding to the decoding of the first plurality of bits by hard decoding.

7. The method of claim 1, further comprising:
generating, in response to an indication of failure corresponding to the decoding the first plurality of bits based on the LLR, a third voltage threshold corresponding to the read voltage for the first plurality of bits.

8. The method of claim 7, further comprising:
allocating, to a second voltage range bounded by the third voltage threshold, a log-likelihood ratio (LLR); and
decoding, based on the LLR corresponding to the second voltage range, the first plurality of bits.

9. The method of claim 7, the first voltage threshold corresponding to a first plurality of voltage thresholds, the third voltage threshold corresponding to a third plurality of voltage thresholds, and the voltage ranges corresponding to a plurality of voltage ranges between adjacent ones of the first plurality of voltage thresholds and the third plurality of voltage thresholds.

10. A memory system comprising:
a non-volatile memory; and
a controller for performing operations of the non-volatile memory, the controller being configured to:
select a plurality of memory locations at a memory device, the memory locations corresponding to a first page including a first plurality of bits and a second page including a second plurality of bits;
modify, based on the first plurality of bits and the second plurality of bits, a first voltage threshold corresponding to a read voltage for the first plurality of bits;
allocate, to a voltage range bounded by the first voltage threshold, a log-likelihood ratio (LLR); and
decode, based on the LLR corresponding to the voltage range, the first plurality of bits.

11. The system of claim 10, the controller further configured to:
generate, based on the first plurality of bits and the second plurality of bits, a histogram corresponding to the first plurality of bits; and
modify, based on the first voltage threshold corresponding to the histogram, one or more of the first voltage threshold and the second voltage threshold,
the voltage range bounded by the first voltage threshold and the second voltage threshold.

12. The system of claim 10, the controller further configured to:
modify, based on the first voltage threshold and a second voltage threshold corresponding to a read operation of the first plurality of bits, one or more of the first voltage threshold and the second voltage threshold.

13. The system of claim 12, the controller further configured to:
generate a magnitude of the LLR based on one or more of a voltage bounded by the voltage range, the second voltage threshold, the first plurality of bits, and the second plurality of bits.

14. The system of claim 12, the first voltage threshold corresponding to a first plurality of voltage thresholds, the second voltage threshold corresponding to a second plurality of voltage thresholds, and the voltage ranges corresponding to a plurality of voltage ranges between adjacent ones of the first plurality of voltage thresholds and the second plurality of voltage thresholds.

15. The system of claim 10, the controller further configured to:
decode, based on the first plurality of bits and the second plurality of bits, the first plurality of bits by hard decoding; and
modify the first voltage threshold, in response to an indication of failure corresponding to the decoding of the first plurality of bits by hard decoding.

16. The system of claim 10, the controller further configured to:
generate, in response to an indication of failure corresponding to the decoding the first plurality of bits based on the LLR, a third voltage threshold corresponding to the read voltage for the first plurality of bits.

17. The system of claim 16, the controller further configured to:
allocate, to a second voltage range bounded by the third voltage threshold, a log-likelihood ratio (LLR); and
decode, based on the LLR corresponding to the second voltage range, the first plurality of bits.

18. The system of claim 16, the first voltage threshold corresponding to a first plurality of voltage thresholds, the third voltage threshold corresponding to a third plurality of voltage thresholds, and the voltage ranges corresponding to a plurality of voltage ranges between adjacent ones of the first plurality of voltage thresholds and the third plurality of voltage thresholds.

19. A non-transitory computer readable medium including one or more instructions stored thereon and executable by a processor to:
select, by a processor, a plurality of memory locations at a memory device, the memory locations corresponding to a first page including a first plurality of bits and a second page including a second plurality of bits;
modify, by the processor and based on the first plurality of bits and the second plurality of bits, a first voltage threshold corresponding to a read voltage for the first plurality of bits;
allocate, by the processor to a voltage range bounded by the first voltage threshold, a log-likelihood ratio (LLR); and
decode, by the processor and based on the LLR corresponding to the voltage range, the first plurality of bits.

20. The computer readable medium of claim 19, wherein the computer readable medium further includes one or more instructions executable by the processor to:
generate, by the processor and based on the first plurality of bits and the second plurality of bits, a histogram corresponding to the first plurality of bits; and
modify, by the processor and based on the first voltage threshold corresponding to the histogram, one or more of the first voltage threshold and the second voltage threshold,
the voltage range bounded by the first voltage threshold and the second voltage threshold.

* * * * *